(12) United States Patent
Matsushita et al.

(10) Patent No.: US 7,043,384 B2
(45) Date of Patent: May 9, 2006

(54) FAILURE DETECTION SYSTEM, FAILURE DETECTION METHOD, AND COMPUTER PROGRAM PRODUCT

(75) Inventors: Hiroshi Matsushita, Kanagawa (JP); Kenichi Kadota, Kanagawa (JP); Yoshiyuki Shioyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 10/784,819

(22) Filed: Feb. 24, 2004

(65) Prior Publication Data

US 2005/0102591 A1 May 12, 2005

(30) Foreign Application Priority Data

Nov. 7, 2003 (JP) ............................. P2003-378195

(51) Int. Cl.
*G01R 31/28* (2006.01)
*G01R 31/00* (2006.01)

(52) U.S. Cl. .......................... 702/81; 702/118; 324/500
(58) Field of Classification Search .................. 702/58, 702/59, 81–84, 117, 118, 121, 179, 181; 700/109–111; 324/500
See application file for complete search history.

(56) References Cited

U.S. PATENT DOCUMENTS

| | | | |
|---|---|---|---|
| 6,392,434 B1 * | 5/2002 | Chiu ........................... | 324/765 |
| 6,694,208 B1 * | 2/2004 | Sheu et al. .................. | 700/121 |
| 6,775,630 B1 * | 8/2004 | Behkami et al. .............. | 702/81 |
| 2003/0011376 A1 | 1/2003 | Matsushita et al. .......... | 324/500 |
| 2003/0055592 A1 * | 3/2003 | Buckheit et al. ............ | 702/120 |
| 2004/0049722 A1 | 3/2004 | Matsushita | |

FOREIGN PATENT DOCUMENTS

JP          2002-359266          12/2002

OTHER PUBLICATIONS

Mitsutake, K. et al., "New Method of Extraction of Systematic Failure Component", Proc. 10th Int. Symp. Semiconductor Manufacturing, pp. 247-250, (2001).
Sugimoto, M. et al., "Characterization Algorithm of Failure Distribution for LSI Yield Improvement", Proc. 10th Int. Symp. Semiconductor Manufacturing, pp. 275-278, (2001).

(Continued)

*Primary Examiner*—Marc S. Hoff
*Assistant Examiner*—Manuel L Barbee
(74) *Attorney, Agent, or Firm*—Finnegan, Henderson, Farabow, Garrett & Dunner, L.L.P.

(57) ABSTRACT

A failure detection system includes a wafer test information input unit which acquires pass/fail maps for wafers for a plurality of types of semiconductor devices, displaying failure chip areas based on results of electrical tests performed on chips; an analogous test information input unit which classifies the electrical tests into analogous electrical tests with regard to analogous failures among the semiconductor devices; a subarea setting unit which assigns subareas common to the types of semiconductor devices on a wafer surface; a characteristic quantity calculation unit which statistically calculates characteristic quantities based on a number of the failure chip areas included in the subareas for each analogous electrical test; and a categorization unit which obtains correlation coefficients between the characteristic quantities corresponding to the subareas, and classifies clustering failure patterns of the failure chip areas into categories by comparing the correlation coefficients with a threshold.

20 Claims, 21 Drawing Sheets

OTHER PUBLICATIONS

Nakamae, K. et al., "Fail Pattern Classification and Analysis System of Memory Fail Bit Maps", Proc. 4$^{th}$ Int. Conf. Modeling and Simulation of Microsystems, pp. 598-601, (2001).

U.S. Appl. No. 10/865,927, filed Jun. 14, 2004, to Matsushita et al.

U.S. Appl. No. 10/801,992, filed Mar. 17, 2004, to Matsushita et al.

* cited by examiner

FIG. 2
| PRODUCT NAME | PRODUCT | CHIP LAYOUT |
|---|---|---|
| PRODUCT A | MEMORY | 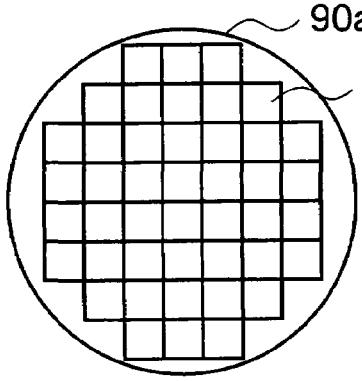 90a, 92 |
| PRODUCT B | LOGIC | 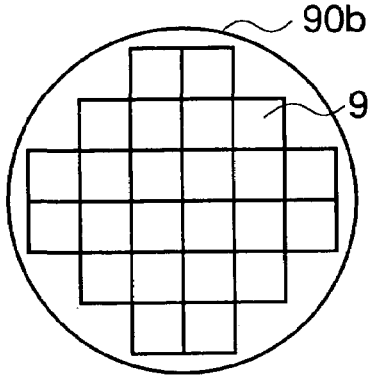 90b, 94 |
| PRODUCT C | MEMORY MERGED LOGIC | 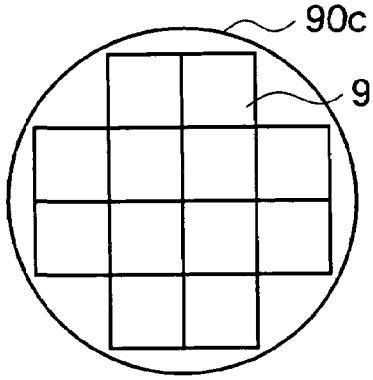 90c, 96 |

FIG. 3

| PRODUCT A | | PRODUCT B | | PRODUCT C | |
|---|---|---|---|---|---|
| ELECTRIC TEST | FAILURE CODE | ELECTRIC TEST | FAILURE CODE | ELECTRIC TEST | FAILURE CODE |
| DC | DC | POWER SHORT | PS | DC | DC |
| FUNCTION | FC | FUNCTION | FC | AD / DA1 | A1 |
| MARGIN | MA | FREQUENCY | FQ | AD / DA2 | A2 |
| | | OTHER LOGIC | OL | | |

FIG. 4

| ANALOGOUS ELECTRIC TEST 1 | | | ANALOGOUS ELECTRIC TEST 2 | | | ANALOGOUS ELECTRIC TEST 3 | | |
|---|---|---|---|---|---|---|---|---|
| PRODUCT | ELECTRIC TEST | FAILURE CODE | PRODUCT | ELECTRIC TEST | FAILURE CODE | PRODUCT | ELECTRIC TEST | FAILURE CODE |
| PRODUCT A | DC | DC | PRODUCT A | FUNCTION | FC | PRODUCT A | MARGIN | MA |
| PRODUCT B | POWER SHORT | PS | PRODUCT B | FUNCTION | FC | PRODUCT B | FREQUENCY | FQ |
| PRODUCT C | DC | DC | PRODUCT C | OTHER LOGIC | OL | PRODUCT C | AD/DA2 | A2 |
| | | | PRODUCT D | AD/DA1 | A1 | | | |

FIG. 5
| PRODUCT A WAFER NUMBER | ELECTRIC TEST RESULT |
|---|---|
| 1 | 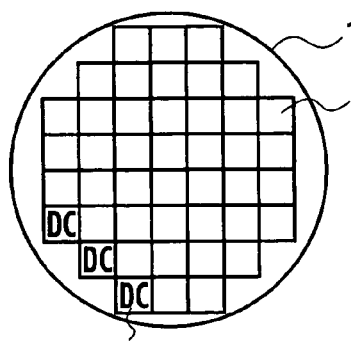 |
| 2 | 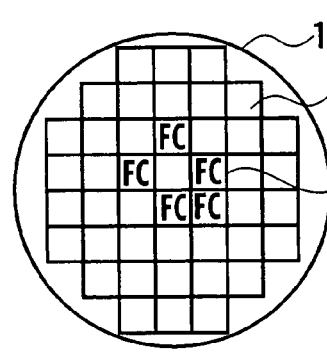 |
| 3 | 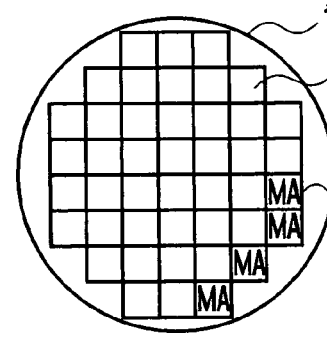 |
| 4 | 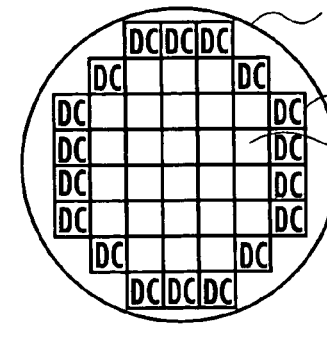 |

FIG. 6
| PRODUCT B WAFER NUMBER | ELECTRIC TEST RESULT |
|---|---|
| 5 | 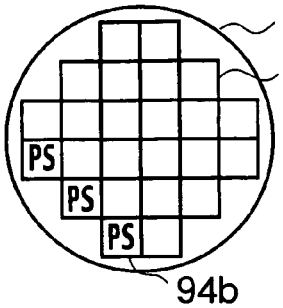 |
| 6 | 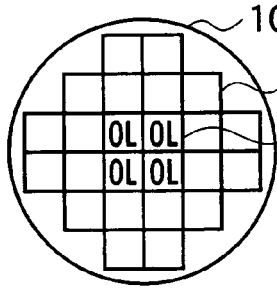 |
| 7 | 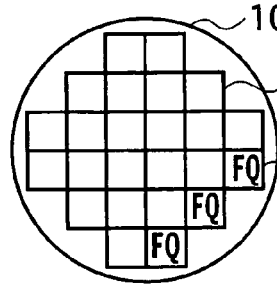 |
| 8 | 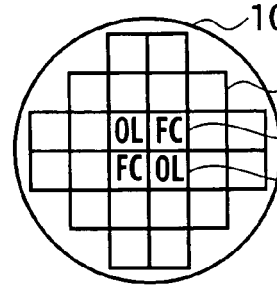 |
| 9 | 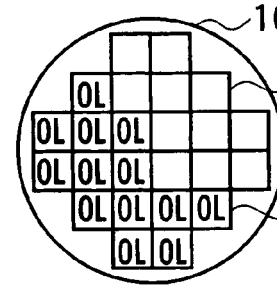 |

FIG. 7
| PRODUCT C WAFER NUMBER | ELECTRIC TEST RESULT |
|---|---|
| 10 | 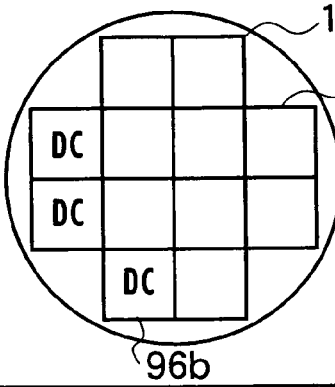 |
| 11 | 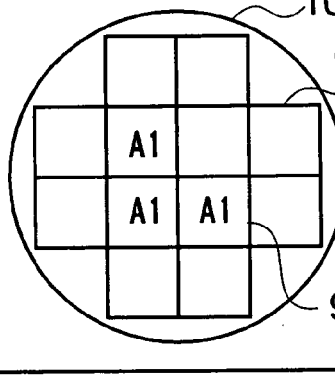 |
| 12 | 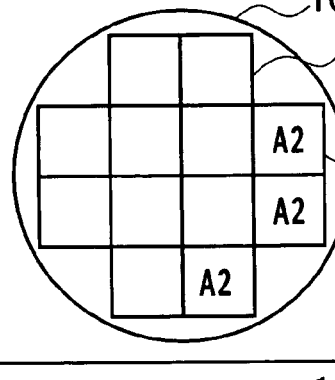 |
| 13 | 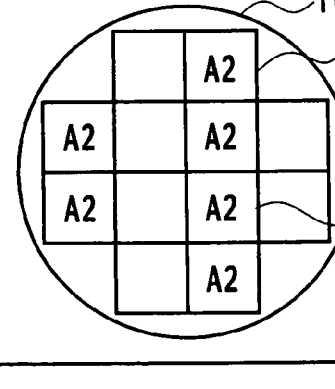 |

| AREA NUMBER | SUBAREA |
|---|---|
| 1 | [ DR$_3$OUTSIDE ] V [ DL$_3$-DL$_4$-DL$_5$-DL$_6$-DL$_7$ ] |
| 2 | [ DR$_3$OUTSIDE ] V [ DL$_7$-DL$_8$-DL$_1$-DL$_2$-DL$_3$ ] |
| 3 | [ DR$_2$OUTSIDE ] V [ DL$_8$-DL$_1$-DL$_2$-DL$_3$-DL$_4$ ] |
| ⋮ | ⋮ |
| 76 | [ DR$_2$INSIDE ] V [ DL$_3$-DL$_4$-DL$_5$ ] |
| ⋮ | ⋮ |
| 150 | [ DR$_1$INSIDE ] V [ DL$_4$-DL$_5$-DL$_6$-DL$_7$-DL$_8$ ] |

FIG. 14

| PRODUCT A | | | | | |
|---|---|---|---|---|---|
| ELECTRIC TEST | AREA NUMBER | WAFER NUMBER | | | |
| | | 1 | 2 | 3 | 4 |
| DC | 1 | 0.3 | 0 | 0.01 | 0.32 |
| | 2 | 0.5 | 0 | 0 | 0.12 |
| | 3 | 0.2 | 0.01 | 0 | 0.05 |
| | ⋮ | ⋮ | ⋮ | ⋮ | ⋮ |
| | 150 | 0.5 | 0 | 0 | 0.32 |
| FUNCTION | 1 | 0 | 0.67 | 0 | 0 |
| | 2 | 0 | 0.23 | 0.02 | 0 |
| | 3 | 0.01 | 0.15 | 0 | 0.01 |
| | ⋮ | ⋮ | ⋮ | ⋮ | ⋮ |
| | 150 | 0 | 0.42 | 0 | 0 |
| MARGIN | 1 | 0 | 0 | 0.2 | 0.01 |
| | 2 | 0 | 0.01 | 0.1 | 0 |
| | 3 | 0 | 0 | 0.03 | 0 |
| | ⋮ | ⋮ | ⋮ | ⋮ | ⋮ |
| | 150 | 0.02 | 0 | 0.12 | 0 |

FIG. 15

| ANALOGOUS ELECTRIC TEST | PRODUCT A, WAFER No.1 | | | PRODUCT B, WAFER No.5 | | |
|---|---|---|---|---|---|---|
| | ELECTRIC TEST | AREA NUMBER | FAILURE DENSITY | ELECTRIC TEST | AREA NUMBER | FAILURE DENSITY |
| ANALOGOUS ELECTRIC TEST 1 | DC FAILURE | 1 | 0.3 | POWER SHORT FAILURE | 1 | 0.28 |
| | | 2 | 0.5 | | 2 | 0.43 |
| | | 3 | 0.2 | | 3 | 0.1 |
| | | ⋮ | ⋮ | | ⋮ | ⋮ |
| | | 150 | 0.5 | | 150 | 0.67 |
| ANALOGOUS ELECTRIC TEST 2 | FUNCTION FAILURE | 1 | 0 | FUNCTION FAILURE + OTHER LOGIC FAILURE | 1 | 0 |
| | | 2 | 0 | | 2 | 0.01 |
| | | 3 | 0.01 | | 3 | 0 |
| | | ⋮ | ⋮ | | ⋮ | ⋮ |
| | | 150 | 0 | | 150 | 0 |
| ANALOGOUS ELECTRIC TEST 3 | MARGIN FAILURE | 1 | 0 | FREQUENCY FAILURE | 1 | 0 |
| | | 2 | 0 | | 2 | 0.01 |
| | | 3 | 0 | | 3 | 0 |
| | | ⋮ | ⋮ | | ⋮ | ⋮ |
| | | 150 | 0.02 | | 150 | 0 |

FIG. 16

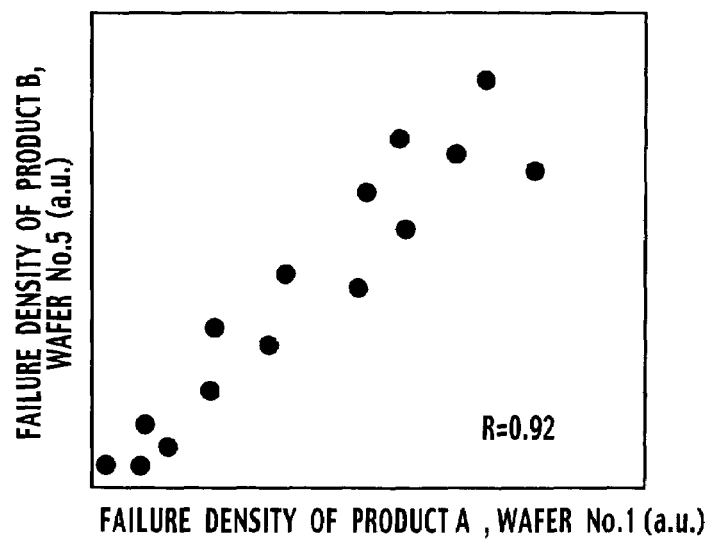

FIG. 17

| | PRODUCT A WAFER No.1 | PRODUCT A WAFER No.2 | PRODUCT A WAFER No.3 | PRODUCT A WAFER No.4 | PRODUCT B WAFER No.5 | ... | PRODUCT C WAFER No.10 | ... | PRODUCT C WAFER No.13 |
|---|---|---|---|---|---|---|---|---|---|
| PRODUCT A WAFER No.1 | 1 | 0.01 | 0.12 | 0.08 | 0.92 | | 0.91 | | 0.01 |
| PRODUCT A WAFER No.2 | 0.01 | 1 | 0.03 | 0.09 | 0.08 | ...... | 0.01 | ... | 0.01 |
| PRODUCT A WAFER No.3 | 0.12 | 0.03 | 1 | 0.12 | 0.01 | | 0.09 | | 0.01 |
| PRODUCT A WAFER No.4 | 0.08 | 0.09 | 0.12 | 1 | 0.23 | | 0.01 | | 0.02 |
| PRODUCT B WAFER No.5 | 0.92 | 0.08 | 0.01 | 0.23 | 1 | | 0.87 | | 0.09 |
| ... | | | | | | | | | |
| PRODUCT C WAFER No.10 | 0.91 | 0.01 | 0.09 | 0.01 | 0.87 | ...... | 1 | ... | 0.07 |
| ... | | | | | | | | | |
| PRODUCT C WAFER No.13 | 0.01 | 0.01 | 0.01 | 0.02 | 0.09 | ...... | 0.07 | ... | 1 |

FIG. 22

| | PASS / FAIL MAP | ABNORMAL PROCESS NUMBER | ABNORMAL MANUFACTURING APPRATUS | TEST STATISTIC |
|---|---|---|---|---|
| CATEGORY 7 | | 136 | M1 | 13.6 |
| CATEGORY 8 | | 96 | P1 | 12.7 |

FIG. 25

| | PASS/FAIL MAP | VARIATION OF TEST STATISTIC | ABNORMAL PROCESS NUMBER | ABNORMAL MANUFACTURING APPARATUS | TEST STATISTIC |
|---|---|---|---|---|---|
| CATEGORY 7 | | D1 AREA DIVIDING METHOD<br>D1: DIVIDING CIRCLE: 2<br>DIVIDING LINE: 5 | 136 | M1 | 27.6 |
| CATEGORY 8 | | D2 AREA DIVIDING METHOD<br>D2: DIVIDING CIRCLE: 6<br>DIVIDING LINE: 12 | 82 | P2 | 24.3 |

FAILURE DETECTION SYSTEM, FAILURE DETECTION METHOD, AND COMPUTER PROGRAM PRODUCT

CROSS REFERENCE TO RELATED APPLICATIONS

This application is based upon and claims the benefit of priority from prior Japanese Patent Application P2003-378195 filed on Nov. 7, 2003; the entire contents of which are incorporated by reference herein.

BACKGROUND OF THE INVENTION

1. Field of the Invention

The present invention relates to detection of an abnormality in a manufacturing process of a semiconductor integrated circuit. Particularly, the present invention relates to a failure detection system, a failure detection method and a computer program product for detecting the cause of a clustering failure.

2. Description of the Related Art

One of the most important problems leading to better productivity in the production of a semiconductor device such as a large-scale integrated circuit (LSI) is to improve a yield rate. In order to improve the yield rate, it is important, by analyzing a yield loss, to analyze a manufacturing process, a manufacturing apparatus or a design condition, which caused the yield loss, and to take remedial measures to avoid or prevent yield loss. However, the LSI is produced, for example, by a sequence of several hundred processes and manufacturing apparatuses. Accordingly, once a failure occurs in the LSI, it is very difficult in general to detect a reason for the failure.

Test results of electrical characteristics of a wafer conducted after completion of a wafer process in the LSI production, sometimes give an important clue for identifying the reason for the failure. This is because the wafer tests are performed on a wafer after completion of the production process. The results of the wafer test are mapped and displayed with respect to positions on a wafer surface, and failure positions on the wafer surface are detected. A representative example of such a map is a fail bit map (FBM) acquired in a memory product. In a logic product, a merged memory logic product and the like, a pass/fail map where a nondefective chip (pass) or a defective chip (fail) are mapped and displayed is acquired by the test.

A failure distribution on the wafer surface may be classified into two types in broad terms, which are: a random failure in which failures are evenly distributed regardless of positions on the wafer surface; and a clustering failure in which the failures disproportionately occur in a portion of the wafer surface. In many cases, the clustering failure is caused by a systematic factor attributable to the manufacturing process, the manufacturing apparatus and the like. The clustering failure is a major reason for a decrease in the yield rate. The failure attributable to the manufacturing process, manufacturing apparatus and the like generates a failure pattern inherent in the manufacturing process and the manufacturing apparatus on the wafer surface. Hence, a pattern analysis of the clustering failure is a clue for identifying the reason for the occurrence of the failure.

Detection of the reason for a failure in the production of an electronic device such as the LSI is implemented by tracing back into the manufacturing record of the LSI for wafers or manufacturing lots in which the same clustering failure has occurred. For example, a search is made as to whether or not there is a commonly used manufacturing apparatus for processed wafers on which the same clustering failures have occurred in the same manufacturing process. For detecting the reason for a failure, there has been proposed a method of implementing a significance test for the manufacturing apparatuses regarding characteristic quantities obtained by quantifying the clustering failures (refer to Japanese Patent Laid-Open No. 2002-359266).

In recent years, an LSI such as an application specific integrated circuit (ASIC) has been developed. In manufacturing equipment for the ASIC, a small volume production of many different items is performed, in which types of products to be produced are increased while the production volume of each type is necessarily small. In order to detect the reason for the failure of an ASIC due to a clustering failure, it is necessary to extract a commonality in the failure patterns in the entire manufacturing equipment. However, since algorithms for computing the characteristic quantity are created for each type of product, it is difficult to extract similarities from among the clustering failure patterns beyond categories of the product types. This is because chip sizes and chip layouts on the wafer surfaces differ depending on the product types, and further, because test items of electrical characteristics, which are performed in the wafer tests, also differ depending on the product types. Even if a commonality in the clustering failures is extracted from certain types of products produced in the manufacturing equipment for the small volume production of many different items, it does not mean that the failures in the entire manufacturing equipment are extracted. Therefore, even if a significance test of the manufacturing record data is performed, the cause of such an abnormality cannot be detected. Moreover, when the clustering failure is only observed in a single production type, the possibility that the occurrence of the clustering failure is not caused by the manufacturing apparatus is high. Consequently, development of measures to prevent the occurrence of the failure is delayed.

SUMMARY OF THE INVENTION

A first aspect of the present invention inheres in a failure detection system, including: a wafer test information input unit configured to acquire pass/fail maps for respective wafers for a plurality of types of semiconductor devices, the pass/fail maps displaying failure chip areas based on results of a plurality of electrical tests performed on a plurality of chip areas assigned on the respective wafers; an analogous test information input unit configured to classify the electrical tests into a plurality of analogous electrical tests with regard to analogous failures among the semiconductor devices; a subarea setting unit configured to assign a plurality of subareas, each of which is common to the types of semiconductor devices on a surface of the wafer; a characteristic quantity calculation unit configured to statistically calculate characteristic quantities based on a number of the failure chip areas included in the respective subareas for each of the analogous electrical tests; and a categorization unit configured to obtain correlation coefficients between the characteristic quantities corresponding to the respective subareas of the wafers, and to classify clustering failure patterns of the failure chip areas into categories by comparing the correlation coefficients with a threshold value.

A second aspect of the present invention inheres in a failure detection method, including: manufacturing wafers having a plurality of types of semiconductor devices in manufacturing equipment; acquiring pass/fail maps displaying failure chip areas based on results of a plurality of electrical tests performed on a plurality of chip areas assigned on the respective wafers; classifying the electrical tests into a plurality of analogous electrical tests with regard to analogous failures among the semiconductor devices; assigning a plurality of subareas, each of which is common to the types of semiconductor devices on a surface of the wafer; statistically calculating characteristic quantities based on a number of the failure chip areas included in the respective subareas for each of the analogous electrical tests; and obtaining correlation coefficients between the characteristic quantities of the wafers corresponding to the subareas to classify clustering failure patterns of the failure chip areas into categories by comparing the correlation coefficients with a threshold value.

A third aspect of the present invention inheres in a computer program product configured to be executed by a computer, including: an instruction of acquiring pass/fail maps for respective wafers of a plurality of types of semiconductor devices, the pass/fail maps displaying failure chip areas based on results of a plurality of electrical tests performed on a plurality of chip areas assigned on each of the respective wafers; an instruction of classifying the electrical tests into a plurality of analogous electrical tests with regard to analogous failures among the semiconductor devices; an instruction of assigning a plurality of subareas, each of which is common to the types of semiconductor devices on a surface of the wafer; an instruction of statistically calculating characteristic quantities based on a number of the failure chip areas included in the respective subareas for each of the analogous electrical tests; and an instruction of obtaining correlation coefficients between the characteristic quantities of the wafers corresponding to the respective subareas to classify clustering failure patterns of the failure chip areas into categories by comparing the correlation coefficients with a threshold value.

BRIEF DESCRIPTION OF THE DRAWINGS

FIG. 2 is a table showing an example of types of products in manufacturing equipment for a small volume production of many different items, for use in explaining the first embodiment of the present invention.

FIG. 3 is a table showing an example of electrical test items for use in explaining the first embodiment of the present invention.

FIG. 4 is a table showing an example of grouping of mutually analogous electrical test modes for use in explaining the first embodiment of the present invention.

FIG. 5 is a view showing an example of wafer test results of a product A for use in explaining the first embodiment of the present invention.

FIG. 6 is a view showing an example of wafer test results of a product B for use in explaining the first embodiment of the present invention.

FIG. 7 is a view showing an example of wafer test results of a product C for use in explaining the first embodiment of the present invention.

FIG. 14 is a table showing an example of respective components of characteristic quantities for use in explaining the first embodiment of the present invention.

FIG. 15 is a table showing an example where the characteristic quantity components in the same subareas of two wafers are appendressed to each other for the analogous electrical tests for use in explaining the first embodiment of the present invention.

FIG. 16 is a scatter diagram illustrated by use of the characteristic quantity components in the same subareas for the analogous electrical tests for use in the first embodiment of the present invention.

FIG. 17 is a table showing an example of correlation coefficients of the characteristic quantity components obtained for all pairs of wafers to be classified, for use in explaining the first embodiment of the present invention.

FIG. 22 is a view showing an example of results of tests regarding failure categories and disproportions in records of manufacturing apparatuses, for use in explaining the second embodiment of the present invention.

FIG. 25 is a view showing an example of detection results of abnormal manufacturing apparatuses by an optimized area dividing method for use in explaining the second embodiment of the present invention.

DETAILED DESCRIPTION OF THE INVENTION

Figure 1:
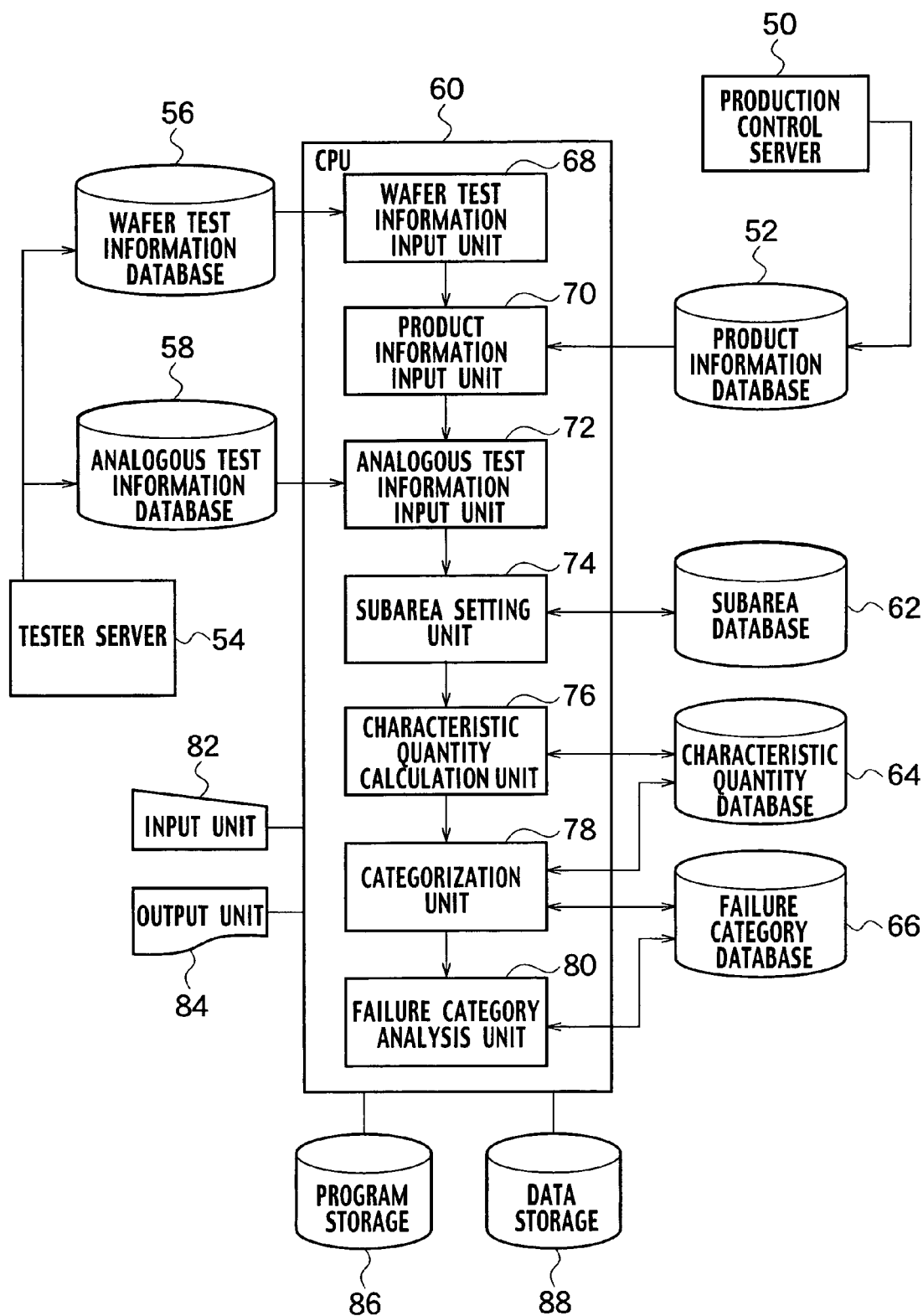
FIG. 1 is a block diagram showing an example of a configuration of a failure detection system according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

As shown in FIG. 1, a failure detection system according to a first embodiment of the present invention includes a product information database 52, a wafer test information database 56, an analogous test information database 58, a subarea database 62, a characteristic quantity database 64, a failure category database 66, and a central processing unit (CPU) 60. The product information database 52 is connected to a production control server 50. Moreover, the wafer test information database 56 and the analogous test information database 58 are connected to a tester server 54. An input unit 82, an output unit 84, a program storage 86, and a data storage 88 and the like, are connected to the CPU 60. Furthermore, the CPU 60 includes a wafer test information input unit 68, a product information input unit 70, an analogous test information input unit 72, a subarea setting unit 74, a characteristic quantity calculation unit 76, a categorization unit 78 and a failure category analysis unit 80.

The input unit 82 refers to devices such as a keyboard and a mouse. When an input operation is performed from the input unit 82, corresponding key information is transmitted to the CPU 60. The output unit 84 refers to a screen such as a monitor, and a liquid crystal display (LCD), a light emitting diode (LED) panel, an electroluminescent (EL) panel and the like. The output unit 84 is controlled by the CPU 60. The output unit 84 displays a pass/fail map obtained from an electrical test, a calculation result of a characteristic quantity obtained by quantifying a clustering failure, and the like. The program storage 86 stores a program for allowing the CPU 60 to implement quantification of a failure pattern, a calculation of a correlation analysis and the like. The data storage 88 temporarily stores data obtained during a calculation and an analysis thereof during the operation of the CPU 60.

In the product information database 52, product information such as manufacturing process flows performed in a clean room and production records of manufacturing apparatuses are stored with regard to a plurality of semiconductor device products by the production control server 50 for controlling manufacturing equipment for a small volume production of many different items. In the manufacturing equipment used in describing the first embodiment, as shown in FIG. 2, various types of semiconductor devices such as a product A, a product B and a product C are manufactured. The product information input unit 70 acquires, from the product information database 52, information concerning the respective semiconductor devices such as the products A, B, and C, which are manufactured in the manufacturing equipment. For example, the product A is a memory product, the product B is a logic product, and the product C is a merged memory logic product.

The respective semiconductor devices of the products A, B and C are fabricated on assemblies of chip areas 92, 94 and 96, each of assembly is disposed on wafers 90a, 90b and 90c, respectively. Because the manufacturing equipment is the same, the wafers 90a, 90b and 90c have the same size. However, since occupied areas of the semiconductor devices differ depending on the types of the products A, B, C, sizes of the chip areas 92, 94, 96 on the wafers 90a, 90b and 90c differ from one another. Accordingly, arrangements of the chip areas 92, 94, 96 on the wafers 90a, 90b, 90c and the numbers thereof also differ from one another. For example, as shown in FIG. 2, regarding the smaller size chip areas 92 of the product A, a large number of chip areas 92 is arranged on the wafer 90a as compared to the number of chip areas 94 and 96. Regarding the larger size chip areas 96 of the product C, the number of chip areas 96 arranged on the wafer 90c is less than the number of chips 92 and 94. The size of the chip areas 94 of the product B is in the middle between the sizes of the chip areas 92 and 96, and the number of chip areas 94 is also in the middle between the number of the chip areas 92 and 96.

In the wafer test information database 56, results obtained from the wafer tests, for example, a pass/fail map and the like are stored by the tester server 54 for controlling testers performing various electrical tests in the manufacturing equipment. In the wafer tests performed for the respective products A, B, C, as shown in FIG. 3, while there are some electrical test items among the products A, B, C which are the same, there are also electrical test items unique to the respective products A, B, C. For example, in the product A, a direct current (DC) test, a function test, a margin test and the like are performed. In the product B, a power short test, a function test, a frequency test, other logic tests and the like are performed. In the product C, the DC test, an analog-digital/digital-analog conversion (AD/DA)1 test, an AD/DA2 test and the like are performed. For failures in the respective electrical tests, which are detected by the wafer tests, failure codes are defined. The respective failure codes of the DC, function, margin, power short, frequency, other logic, AD/DA1, and AD/DA2 tests are represented by "DC", "FC", "MA", "PS", "FQ", "OL", "A1" and "A2".

Here, the DC failure test indicates that a current consumption value when a power source is supplied to a product is abnormal. The FC failure test indicates that a circuit does not perform a desired operation. The MA failure test indicates that a write or read operation speed of a memory does not meet a specification range. The PS failure test indicates that a current consumption is excessive. The FQ failure test indicates that a maximum operation frequency of a logic circuit does not meet a specification requirement. The OL failure test indicates that a logic circuit does not perform a desired operation. The A1 failure test indicates that an analog/digital or digital/analog conversion circuit does not perform a desired operation. The A2 failure test indicates that an operation characteristic of an analog/digital or digital/analog conversion circuit does not meet a specification requirement.

In the analogous test information database 58, as shown in FIG. 4, analogous test information in which the electrical test items analogous among the different products A, B, C are classified as an analogous electrical test 1, an analogous electrical test 2 and an analogous electrical test 3 is stored by the tester server 54. For example, the DC failure of the product A and the PS failure of the product B in the analogous electrical test 1 are analogous failures in view of abnormality in the current consumption. Moreover, the FC failures of the products A, B, the OL failure of the product B, and the A1 failure of the product C in the analogous electrical test 2 are analogous failures in that the circuits of the semiconductor devices of the products A, B, C do not operate. Furthermore, the MA failure of the product A, the FQ failure of the product B and the A2 failure of the product C in the analogous electrical test 3 are analogous failures in that the operation characteristics are inferior though the circuits thereof operate. There is a possibility that the analogous failures in the analogous electrical tests 1 to 3 occur due to the same reason, and accordingly, are classified as the same failure in the first embodiment.

The wafer test information input unit 68 of the CPU 60 sends the pass/fail map of each wafer, which is acquired from the wafer test information database 56, to the product information input unit 70. The product information input unit 70 appends manufacturing information such as the type, manufacturing history and the like of the semiconductor device, which is acquired from the product information database 52, to the pass/fail map of each wafer sent from the wafer test information input unit 68. For the electrical tests performed for each wafer, the analogous test information input unit 72 acquires the analogous failures belonging to the respective analogous electrical tests 1 to 3, which are acquired from the analogous test information database 58.

In the wafer test, each electrical test is performed for each chip area of the chip areas 92, 94 and 96 of the products A, B and C shown in FIG. 2. For example, on pass/fail maps 100a to 100m of respective wafer numbers 1 to 13 (hereinafter, represented as a wafer #1, a wafer #2, . . . , a wafer #13) of the products A, B, C, the wafer numbers being assigned in the wafer tests, nondefective chip areas 92a, 94a and 96a and defective chip areas 92b to 92d, 94b to 94e and 96b to 96d denoted by failure codes corresponding thereto are indicated based on results of the electrical tests as shown in FIGS. 5 to 7. Thus, showing that various clustering failures have occurred in the products A, B, C.

For example, in the wafer #1 of the product A shown in FIG. 5, the failure chip areas 92b having the DC failures occurred in the vicinity of a lower left side edge of the pass/fail map 100a. In the wafer #2, the failure chip areas 92c having the FC failures occurred in the vicinity of a center portion of the pass/fail map 100b. In the wafer #3, the failure chip areas 92d having the MA failures occurred in the vicinity of a lower right side edge of the pass/fail map 100c. Moreover, in the wafer #4, the failure chip areas 92b having the DC failures occurred around the edge of the pass/fail map 100d.

Moreover, in the wafer #5 of the product B shown in FIG. 6, the failure chip areas 94b having the PS failures occurred in the vicinity of a lower left side edge of the pass/fail map 100e. In the wafer #6, the failure chip areas 94e having the OL failures occurred in the vicinity of a center portion of the pass/fail map 100f. In the wafer #7, the failure chip areas 94d having the FQ failures occurred in the vicinity of a lower right side edge of the pass/fail map 100g. In the wafer #8, the failure chip areas 94e having the OL failures and the failure chip areas 94c with the FC failures both occurred in the vicinity of a center portion of the pass/fail map 100h. Moreover, in the wafer #9, the failure chip area 94e having the OL failures occurred on the lower left half of the surface of the pass/fail map 100i.

In the wafer #10 of the product C shown in FIG. 7, the failure chip areas 96b having the DC failures occurred in the vicinity of a lower left side edge of the pass/fail map 100j. In the wafer #11, the failure chip areas 96c having the A1 failures occurred in the vicinity of a center portion of the pass/fail map 100k. In the wafer #12, the failure chip areas 96d having the A2 failures occurred in the vicinity of a lower right side edge of the pass/fail map 100l. Furthermore, in the wafer #13, the failure chip areas 96d having the A2 failures occurred in a longitudinal direction of the pass/fail map 100m such that columns of the failure chip areas 96d are periodically arrayed side by side.

Although the wafer #1 of the product A and the wafer #10 of the product C are different products, the same clustering DC failures occurred in the vicinities of the lower left side edges of the pass/fail maps 100a, 100j. Moreover, in the wafer #5 of the product B, the clustering failure that is the PS failure occurred in the vicinity of the lower left side edge of the pass/fail map 100e, similar to those of the wafer #1 and the wafer #10. As described above, though the wafer #1, the wafer #5 and the wafer #10 are products different from one another, the wafers #1, #5, #10 show analogous clustering failure patterns. In the wafer #2 of the product A, the wafers #6, #8 of the product B and the wafer #11 of the product C, clustering failure patterns in which the analogous failures that are the FC failures, the OL failures and the A1 failures have occurred in the vicinity of the center portions of the pass/fail maps 100b, 100f, 100h, 100k are shown. Similarly, in the wafer #3 of the product A, the wafer #7 of the product B and the wafer #12 of the product C, clustering failure patterns in which the analogous failures that are the MA failures, the FQ failures and the A2 failures have occurred in the vicinity of the lower right side edges of the pass/fail maps 100c, 100g, 100l are shown. Each of the clustering failures which have occurred in the wafer #4 of the product A, the wafer #9 of the product B and the wafer #13 of the product C shows an independent clustering failure pattern.

For example, when the same clustering failure patterns occur among the different products, it is conceivable that there is a common problem in the manufacturing equipment producing the different products. When a clustering failure pattern occurs only in a specific product, it is conceivable that there is a failure cause inherent in the specific product, such as a design, a specification and the like. As described above, by investigating failure occurrence modes of the different products, assumptions of the failure causes can be made, based on the locations of the failures. Therefore, it is important to implement a classification of the clustering failure patterns for all of the products produced in the manufacturing equipment for the small volume production of many different items.

The subarea database 62 shown in FIG. 1 stores subareas on a wafer surface by a common area dividing method independent of the types of the semiconductor devices. The subarea setting unit 74 of the CPU 60 acquires data of the subareas on the wafer surface from the subarea database 62, and determines chip groups belonging to the respective subareas for the pass/fail maps acquired in the wafer test information input unit 68.

Figures 8, 9:
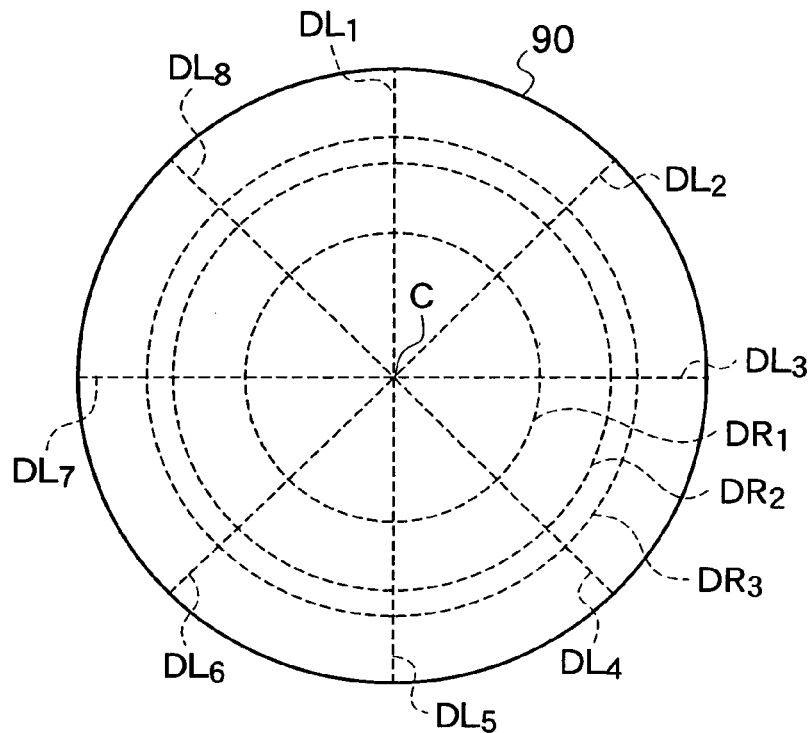
FIG. 8 is a view showing an example of a area dividing method on a wafer surface for use in explaining the first embodiment of the present invention.
FIG. 9 is a table showing an example of subareas set on the wafer surface for use in explaining the first embodiment of the present invention.

In the first embodiment, as shown in FIG. 8, subareas which are common to the respective products A, B, C and do not depend on the type of product are assigned on a surface of a wafer 90. For example, concentric dividing circles $DR_1$ to $DR_3$, each having a center at a center C of the wafer 90 are provided. Radial dividing lines $DL_1$ to $DL_8$ connecting the center C and an edge of the wafer 90 are provided. If a radius of the wafer 90 is denoted as r, radii of the concentric dividing circles $DR_1$ and $DR_2$ are set to (r/2) and (r*3/4), respectively. Moreover, a radius of the concentric dividing circle $DR_3$ is set such that at least half of an area of the outermost peripheral chips remains between the concentric dividing circle $DR_3$ and the edge of the wafer 90. Moreover, the radial dividing lines $DL_2$ to $DL_8$ are set at every 45 degree step clockwise from the radial dividing line $DL_1$ that is a line segment perpendicular to the edge of the wafer 90 from the center C of the wafer 90.

Figure 10:
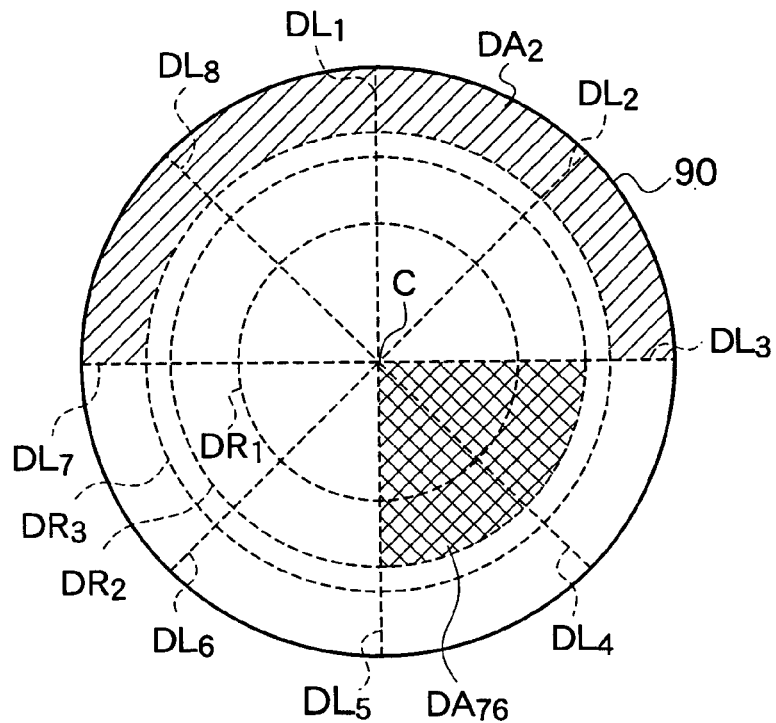
FIG. 10 is a view showing an example of the subareas set on the wafer surface for use in explaining the first embodiment of the present invention.

The concentric dividing circles $DR_1$ to $DR_3$ and the radial dividing lines $DL_1$ to $DL_8$ are combined, and as shown in FIG. 9, the subareas having area numbers 1 to 150 are assigned. Here, a subarea "[Outside of $DR_3$]∩[$DL_3$-$DL_4$-$DL_5$-$DL_6$-$DL_7$]" is a logic product of a area outside of the radial dividing line $DR_3$ of the wafer 90 and a area of the wafer 90 which is partitioned by the radial dividing lines $DL_3$ and $DL_7$ and includes the radial dividing lines $DL_4$ to $DL_6$. For example, a second subarea $DA_2$ of the area number 2 of FIG. 9 is a portion with hatched lines as shown in FIG. 10. Moreover, a 76th subarea $DA_{76}$ of the area number 76 is a portion with cross-hatched line as shown in FIG. 10. Note that the area of each subarea is set larger than a chip area.

Figure 11:
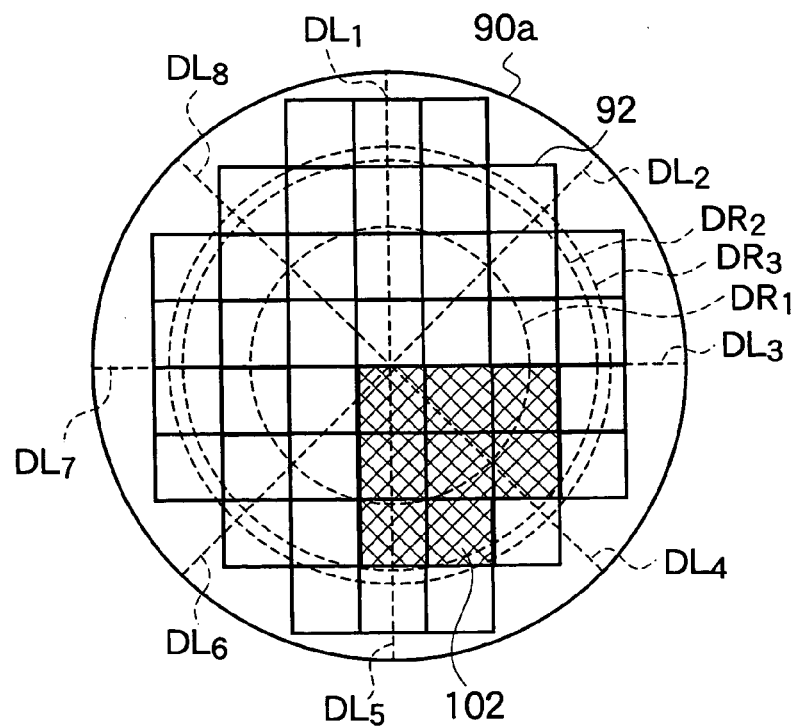
FIG. 11 is a view showing an example of a chip group included in subareas set on the product A for use in explaining the first embodiment of the present invention.
Figure 12:
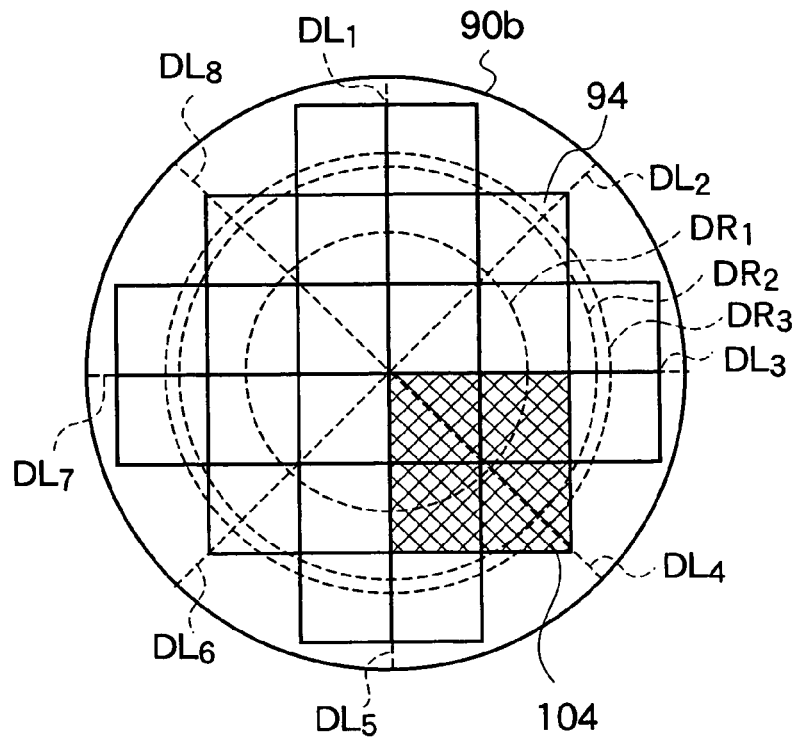
FIG. 12 is a view showing an example of a chip group included in subareas set on the product B for use in explaining the first embodiment of the present invention.
Figure 13:
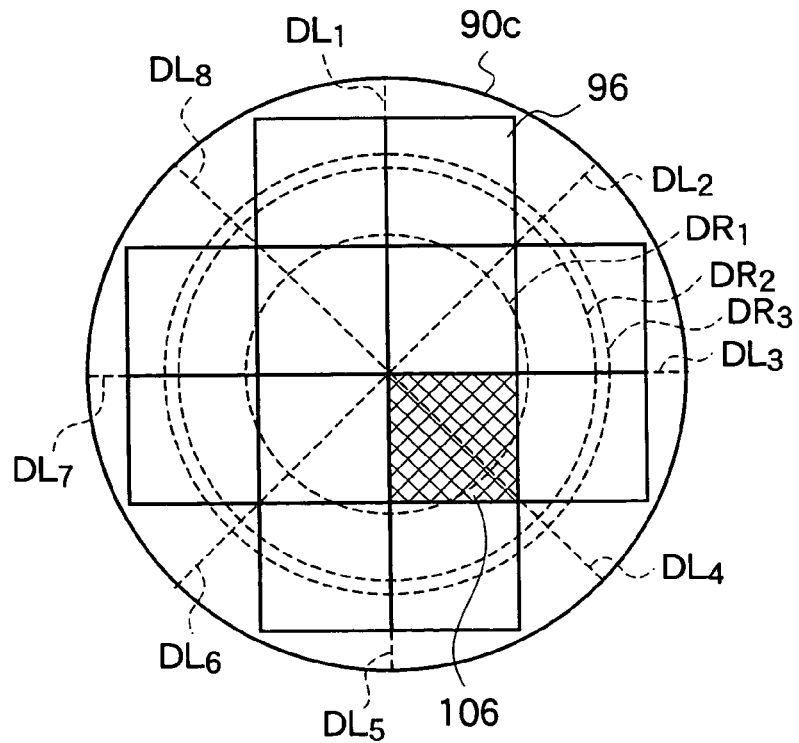
FIG. 13 is a view showing an example of a chip group included in subareas set on the product C for use in explaining the first embodiment of the present invention.

The subarea setting unit 74 determines the chips having an area of 50% or more included in each of the set subareas as a chip group belonging to each subarea. Information relating to the chip group belonging to each subarea is stored in the subarea database 62. For example, in the 76th subareas $DA_{76}$ of the wafers 90a, 90b, 90c of the products A, B, C, chip groups 102, 104, 106, each of which includes at least one chip, are set as shown in cross-hatches of FIGS. 11 to 13. In the wafer 90a of the product A, as shown in FIG. 11, eight chips belong to the chip group 102 which is set in the 76th subarea $DA_{76}$. Moreover, in the wafer 90b of the product B, as shown in FIG. 12, four chips belong to the chip group 104 which is set in the 76th subarea $DA_{76}$. Furthermore, in the wafer 90c of the product C, as shown in FIG. 13, one chip belongs to the chip group 106 which is set in the 76th subarea $DA_{76}$.

The characteristic quantity calculation unit 76 calculates a characteristic quantity by statistically processing the number of failed chips for each electrical test, which are included in the chip group of each subarea, based on the pass/fail map of each wafer, and then stores the calculated characteristic quantity in the characteristic quantity database 64. In the first embodiment, in order to compare the clustering failure patterns among the different products, the clustering failure patterns of the respective products are quantified by a common characteristic quantity independent of the respective products. For the quantification of the clustering failure patterns, a statistical value relating to the number of failures in the chip group belonging to each subarea, which is defined in FIG. 9 is used as the characteristic quantity. As the statistical value, a failure density that is a ratio of the number of failed chips included in the chip group to the total number of chips is obtained. Since the electrical tests to be implemented differ depending on the products, the failure density is calculated for each electrical test. The failure density calculated for each wafer is summarized in a table indicating the electrical tests and the area numbers for each product, and stored in the character quantity database 64. For example, in the product A, the failure densities of the respective wafers are shown for each of the electrical tests and of the area numbers as shown in FIG. 14. Moreover, the characteristic quantity calculation unit 76 classifies the electrical tests to be implemented in the products A, B, C based on the analogous electrical tests 1 to 3 shown in FIG. 4, and summarizes the classified tests in the table. For example, in the product B, components of the failure densities in the function tests and the other logic tests, which are mutually analogous as shown in FIG. 4, are appended.

The categorization unit 78 acquires the characteristic quantities of the wafers of all of the products from the characteristic quantity database 64, and obtains correlations of the characteristic quantities among the respective wafers to categorize the clustering failure patterns. In order to implement such a categorization, as shown in FIG. 15, for example, for the wafer #1 of the product A and the wafer #5 of the product B, the categorization unit 78 addresses the respective components of the failure densities in the same subareas for the analogous electrical tests 1 to 3. FIG. 16 shows a graph illustrated as a scatter diagram in which the corresponding failure density components are plotted. The scatter diagram is created from the table of FIG. 15 obtained for the wafer #1 of the product A and the wafer #5 of the product B. A correlation coefficient R of the failure densities between the wafer #1 of the product A and the wafer #5 of the product B, which is obtained from the scatter diagram shown in FIG. 16, is 0.92. Since the correlation coefficient R of the failure densities exhibits a high value as described above, it can be determined that the failure pattern of the wafer #1 of the product A and the failure pattern of the wafer #5 of the product B are mutually analogous. Similar to the above, also for other pairs of wafers, the scatter diagrams of the failure density components are created from the tables in each of which the characteristic quantity components of the same subareas are illustrated to correspond to each other for the analogous electrical tests 1 to 3.

Figure 18:
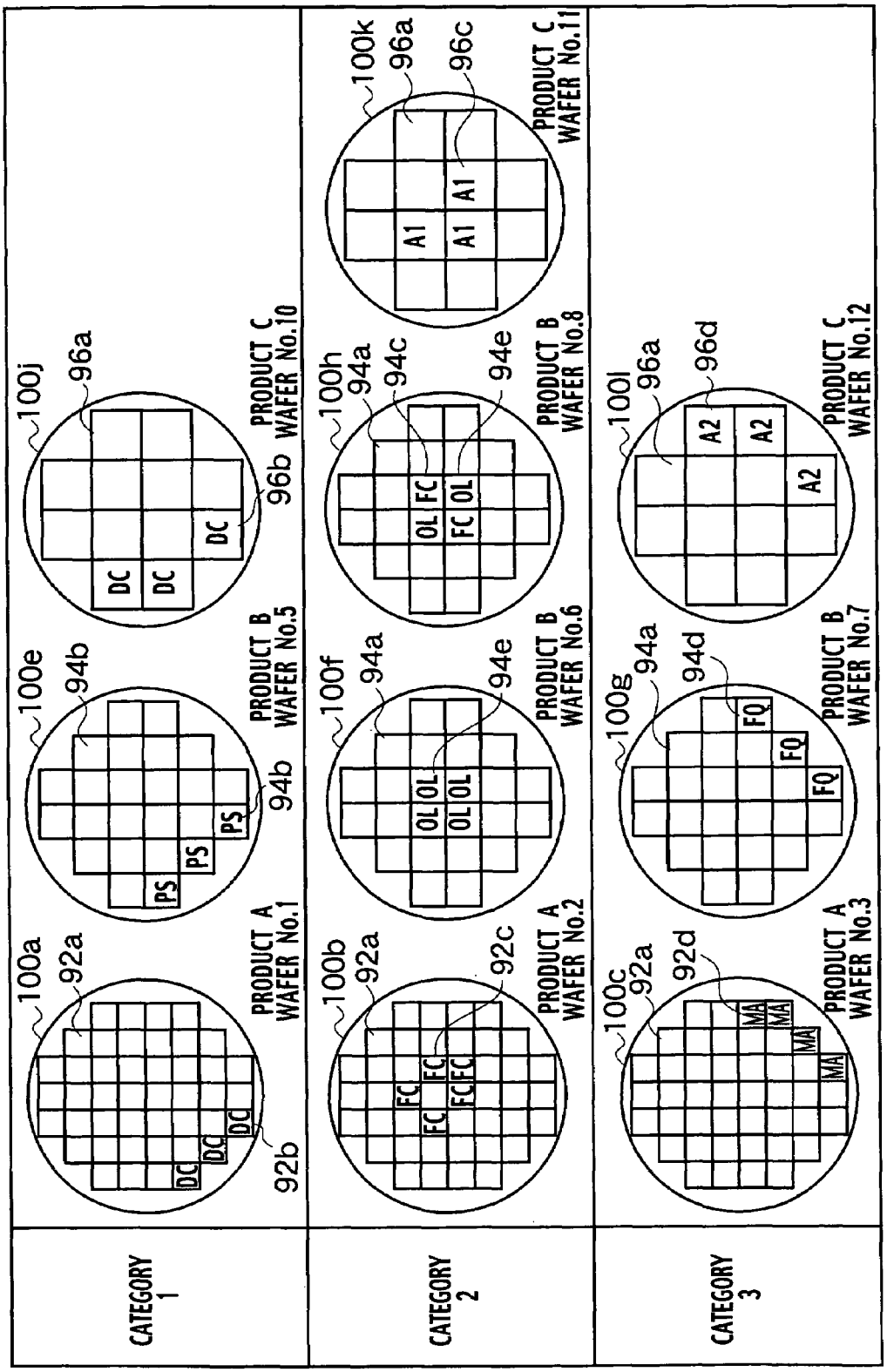
FIG. 18 is a view showing an example where mutually analogous failure patterns are categorized using the correlation coefficients, for use in the first embodiment of the present invention.
Figure 19:
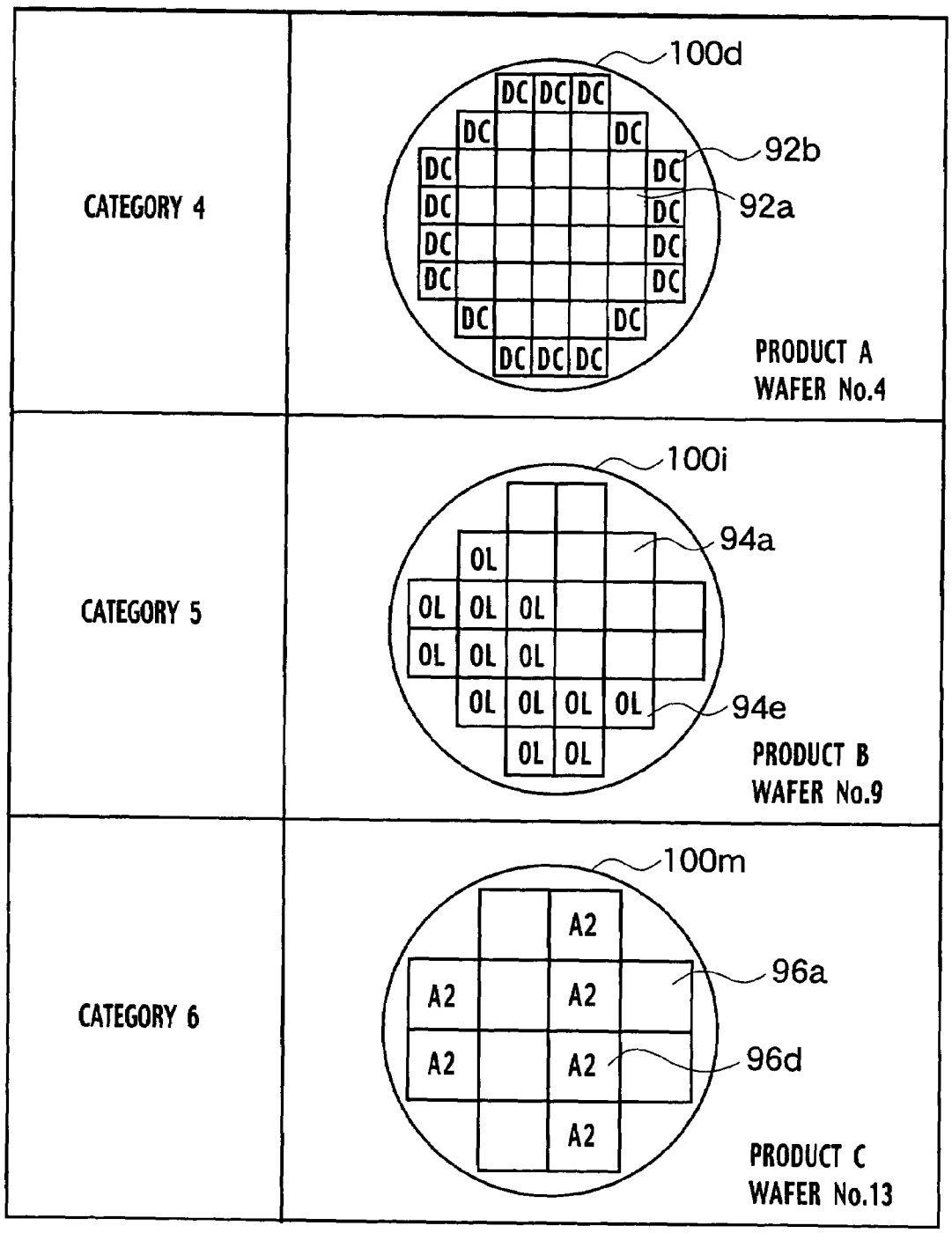
FIG. 19 is a view showing an example where independent failure patterns are categorized using the correlation coefficients according to the first embodiment of the present invention.

Based on the created scatter diagrams, as shown in FIG. 17, the correlation coefficients R are obtained for all of the pairs of wafers. It is determined that failure patterns of a pair of wafers having the correlation coefficient R equal to or more than a preset threshold value are mutually analogous. For example, the threshold value of the correlation coefficients R is set to 0.8. The clustering failure patterns are classified based on the correlation coefficient R between each of the pairs among the wafers #1 to #13. The correlation coefficients R are summarized in FIG. 17. In the first embodiment, as shown in FIGS. 18 and 19, the clustering failure patterns shown in the pass/fail maps 100a to 100m of the wafers #1 to #13 can be classified into categories 1 to 6. For example, the correlation coefficient R between the wafer #1 of the product A and the wafer #5 of the product B is 0.92, and the correlation coefficient R between the wafer #1 of the product A and the wafer #10 of the product C is 0.91. Moreover, the correlation coefficient R between the wafer #5 of the product B and the wafer #10 of the product C is 0.87. The wafers #1, #5, #10 are categorized so as to append to a category 1, as an identifier. Similarly, the wafer #2 of the product A, the wafers #6, #8 of the product B, and the wafer #11 of the product C are categorized into a category 2. Moreover, the wafer #3 of the product A, the wafer #7 of the product B, and the wafer #12 of the product C are categorized into a category 3. The wafer #4 of the product A, the wafer #9 of the product B, and the wafer #13 of the product C in categories 4 to 6, which are shown in FIG. 19, show independent clustering patterns, respectively. The categorization unit 78 stores the categories of the clustering failure patterns, which are acquired based on the correlations of the failure patterns among the wafers, in the failure category database 66.

The failure category analysis unit 80 determines the failure cause by statistically analyzing deviations of the records of the manufacturing apparatuses based on the manufacturing records of the wafers belonging to the respective categories of the categorized clustering failure patterns from the failure category database 66. As shown in FIGS. 18 and 19, in the pass/fail maps 100a to 100m of the wafers #1 to #13, the clustering failure patterns belonging to the categories 1 to 6 have occurred. As described above, it is understood that the common clustering failure pattern independent of the plurality of products has occurred in each of the categories 1 to 3 shown in FIG. 18. Therefore, it can be determined that the clustering failures belonging to the categories 1 to 3 are failures attributable to the manufacturing equipment. The deviations of the records of the manufacturing apparatuses of the wafers belonging to the respective failure categories are analyzed by a chi-square ($\chi^2$) test, thus making it possible to detect a manufacturing apparatus which has caused the failure.

In order to detect the deviations of the records of the manufacturing apparatuses, first, a set of wafers which have a target clustering failure pattern and another set of wafers which do not have the target clustering failure pattern are created. It is assumed that n units of manufacturing apparatuses m1, m2, ..., mn are used in a manufacturing process p. A number of processed wafers in the respective manufacturing apparatuses m1, m2, ..., mn during a target period to be investigated are represented as a1, a2, ..., an. ai (i=1, 2, ..., n) represents a number of processed wafers by a manufacturing apparatus mi. Here, the total number of processed wafers in the process p is represented as:

$$A = a1 + a2 + \ldots + an \quad (1).$$

Moreover, the number of failed wafers, which have the target clustering failure patterns, in the respective manufacturing apparatuses m1, m2 ..., and mn is represented as f1, f2, ..., fn. fi represents a number of failed wafers processed by the manufacturing apparatus mi. Here, the total number of failed wafers is represented as:

$$F = f1 + f2 + \ldots + fn \quad (2).$$

Next, expectation values of the number of failed wafers f1, f2, ..., fn in the respective manufacturing apparatuses m1, m2, ..., mn are represented as e1, e2, ..., en. Here, an expectation value ei of the number of failed wafers fi is represented as:

$$ei = F * ai / A \quad (3).$$

A $\chi^2$ value of the number of failed wafers fi is defined as:

$$\chi^2 i = (fi - ei)^2 / ei \quad (4).$$

Then, a test statistic of the deviations of the manufacturing apparatuses in the manufacturing process p is obtained by:

$$\chi^2 p = \chi^2 1 + \chi^2 2 + \ldots + \chi^2 n \quad (5).$$

If the following inequality is achieved as a result of assigning the test statistic $\chi^2 p$ of the deviations of the manufacturing apparatuses to a $\chi^2$ distribution function $f(\chi^2, n-1)$ of a degree of freedom (n−1):

$$f(\chi^2 p, n-1) < 0.05 \quad (6),$$

then, it is determined, with a reliability of 95% or more, that there are deviations of the manufacturing apparatuses in the manufacturing process p. The larger the test statistic $\chi^2 p$, the smaller the solution of the $\chi^2$ distribution function $f(\chi^2, n-1)$. For example, in the case of six manufacturing apparatuses m1 to m6 used in the manufacturing process p, if the test statistic $\chi^2 p$ is 11 or more, conditions of the inequality (6) are satisfied. Note that, when the record data of the manufacturing apparatuses is not in wafer units but in lot units, a set of lots which have the clustering failure patterns and another set of lots which do not have the clustering failure patterns may be formed. In this case, it is sufficient that the wafers are replaced by the lots in the procedure shown above.

The failure patterns are usually classified for each product manufactured in the manufacturing equipment for the small volume production of many different items, and accordingly, only fragmentary failure occurrence statuses can be detected. Consequently, in a clustering failure pattern of which a failure occurrence frequency is low, it is extremely difficult to detect the manufacturing apparatus causing the failure. In the failure detection system according to the first embodiment of the present invention, the clustering failure patterns are classified for all of the products. Consequently, since the failure occurrence status in the entire manufacturing equipment may become clear, by categorizing the analogous clustering failures occurring in the respective products, it is possible to detect the manufacturing apparatus causing the clustering failure pattern having a low frequency of failure.

On the other hand, each of the clustering failures in the categories 4 to 6 of FIG. 19 occurs only in a single product. When the clustering failure occurs only in a specific product as described above, even though the plurality of products are processed in the same manufacturing equipment, it is estimated with high probability that problems exist in the specification, the design and the like of the product rather than the manufacturing apparatus. By reviewing conditions of the specification and the design of the respective products, it becomes possible to detect the failure cause.

Figure 20:
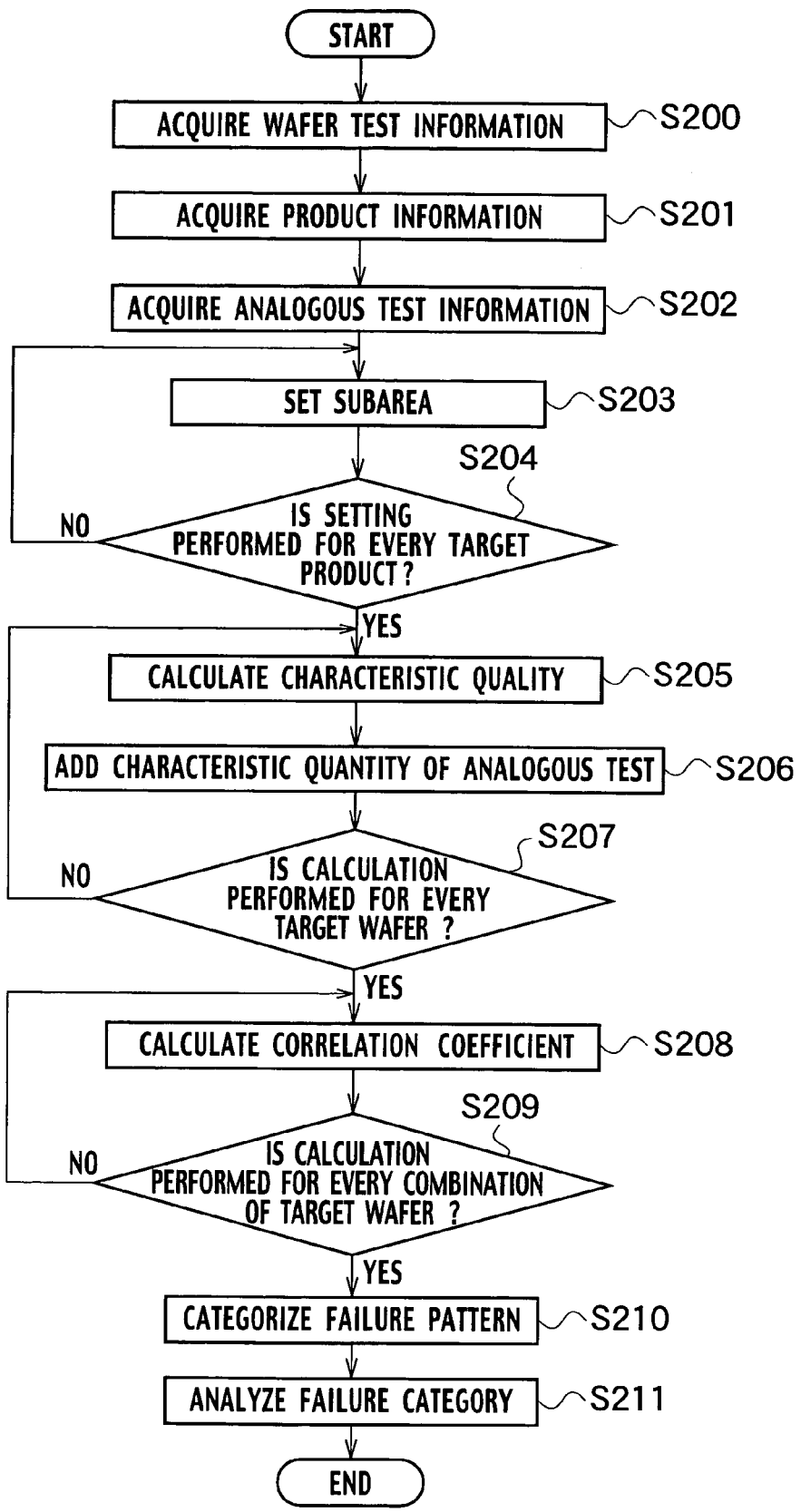
FIG. 20 is a flowchart showing an example of a failure detection method according to the first embodiment of the present invention.

Next, a failure detection method according to the first embodiment of the present invention will be described by use of a flowchart shown in FIG. 20. Inspection target wafers for many different items of semiconductor devices from which the failures are to be detected are manufactured in the manufacturing equipment, and by the production control server 50, manufacturing information about the respective wafers is stored in the product information database 52.

(a) For the manufactured wafers, wafers are tested by a variety of electrical tests corresponding to types of the semiconductor devices by use of testers on the manufacturing equipment. Results of the wafer tests are stored in the wafer test information database 56 by the tester server 54 for controlling the testers.

(b) In Step S200, by the wafer test information input unit 68 of the CPU 60 shown in FIG. 1, pass/fail maps labeled with failure codes of the variety of electrical tests for each wafer are acquired from the wafer test information database 56 storing the results of the wafer tests of a plurality of wafers.

(c) In Step S201, by the product information input unit 70, product information such as the type of the semiconductor device products manufactured in the manufacturing equipment, a manufacturing process, and a manufacturing apparatus is acquired from the product information database 52, and the product information is appended to the pass/fail maps of the respective wafers.

(d) In Step S202, by the analogous test information input unit 72, the analogous test information in which the electrical tests performed for each wafer in the wafer tests are classified so as to correspond to the analogous failures is acquired from the analogous test information database 58.

(e) In Step S203, by the subarea setting unit 74, the subareas assigned on the wafer surface by a method which does not depend on the types of the semiconductor device products are acquired from the subarea database 62. Furthermore, by the subarea setting unit 74, chip groups belonging to the respective subareas are obtained for the pass/fail maps acquired by the wafer test information input unit 68. The setting of the subareas in Step S203 is repeated until the subareas are set for all of the wafers of all target products.

(f) In Step S205, by the characteristic quantity calculation unit 76, the characteristic quantity, for example, the failure density, is calculated by statistically processing the number of failed chips included in the chip group of each subarea based on the pass/fail map of each wafer. Furthermore, in Step S206, the failure density of the analogous failures of the pass/fail map of the same wafer is appended based on the analogous test information. The failure density calculated based on the pass/fail map of each wafer is stored in the characteristic quantity database 64. The calculations of the failure density in Steps S205 and S206 are repeated until the failure densities are calculated for all of the target wafers.

(g) In Step S208, by the categorization unit 78, the correlation coefficients R of the failure densities among the wafers are calculated for the failure densities in the wafers of all the products, which are acquired from the characteristic quantity database 64. The calculation of the correlation coefficients R in Step S208 is repeated until the correlation coefficients R of all the target pairs of wafers are calculated. Furthermore, by the categorization unit 78, it is determined, in Step S210, that the failure patterns of the respective pairs of wafers in which the correlation coefficients R are equal to or more than the preset threshold value are mutually analogous, and the categorization of the clustering failure patterns is implemented. The categorized clustering failure patterns are stored in the failure category database 66.

(h) In Step S211, by the failure category analysis unit 80, the pass/fail maps of the wafers belonging to each category of the categorized clustering failure patterns are acquired from the failure category database 66. When the wafers belonging to the same category are obtained from among the plurality of products, the manufacturing apparatus causing the failure is detected by statistically analyzing the deviations of the records of the manufacturing apparatuses based on the manufacturing record of each wafer belonging to the category.

As described above, in the manufacturing equipment for the small volume production of many different items, in which the semiconductor device products having different chip sizes are manufactured and the variety of electrical tests are performed as the wafer tests, the subareas are set to have an area equal to or larger than the chip sizes without depending on the products. Moreover, the analogous electrical tests are associated with each other, and the characteristic quantity obtained for the types of the electrical tests by quantifying the analogous failure in each subarea is calculated. Therefore, quantification where all of the products are considered equally is possible, and the failure pattern classification without depending on the products can be implemented. Thus, the failure detection method in the manufacturing equipment for the small volume production of many different items is enabled.

Note that, though all of the product types in the manufacturing equipment are set as targets in the first embodiment, the targets may be limited to a part of the products, depending on the situation of the manufacturing equipment. For example, when there is a specific product purposely produced under completely different manufacturing conditions and the product is desired to distinguish from other products manufactured by mass production, it is permissible that the failure detection method according to the first embodiment is applied to the other products excluding the specific product.

(Second Embodiment)

Figure 21:
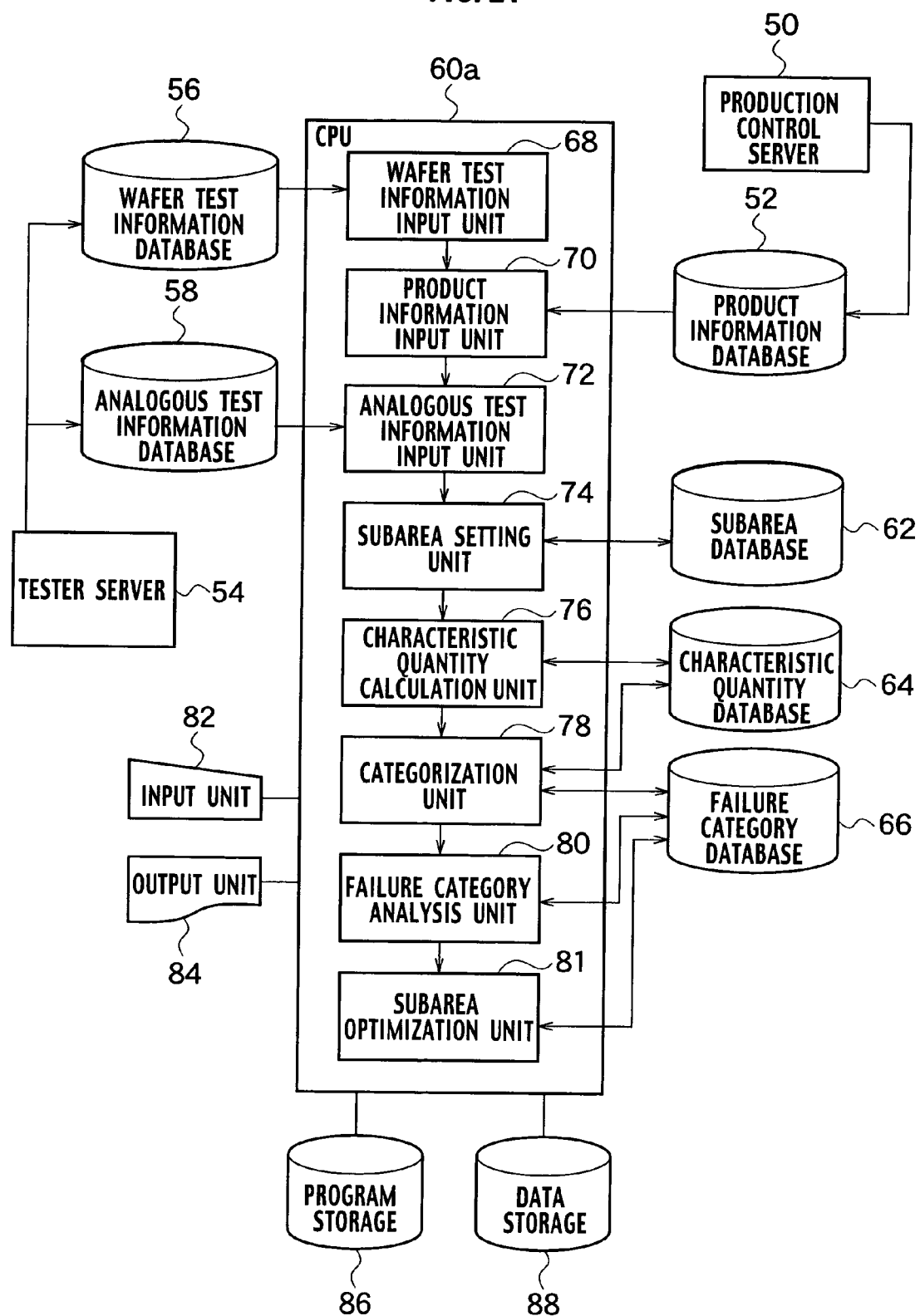
FIG. 21 is a block diagram showing an example of a configuration of a failure detection system according to a second embodiment of the present invention.

As shown in FIG. 21, a failure detection system according to a second embodiment of the present invention includes a product information database 52, a wafer test information database 56, an analogous test information database 58, a subarea database 62, a characteristic quantity database 64, a failure category database 66, and a CPU 60a. The product information database 52 is connected to a production control server 50. Moreover, the wafer test information database 56 and the analogous test information database 58 are connected to a tester server 54. An input unit 82, an output unit 84, a program storage 86, and a data storage 88 are connected to the CPU 60a. Furthermore, the CPU 60a includes a wafer test information input unit 68, a product information input unit 70, an analogous test information input unit 72, a subarea setting unit 74, a characteristic quantity calculation unit 76, a categorization unit 78, a failure category analysis unit 80, and a subarea optimization unit 81.

The failure detection system according to the second embodiment is different from the failure detection system according to the first embodiment shown in FIG. 1 in which the CPU 60a includes the subarea optimization unit 81. Other configurations are similar to those of the first embodiment, and accordingly, repeated description will be omitted.

The subarea setting unit 74 acquires a plurality of subarea settings on a wafer surface by a plurality of setting methods from the subarea database 62. For each of the plurality of subarea settings, the manufacturing apparatus causing the failure is detected by statistically analyzing the deviations of the records of the manufacturing apparatuses based on the manufacturing record of each wafer belonging to the failure category categorized by the characteristic quantity calculation unit 76, the categorization unit 78 and the failure category analysis unit 80. The subarea optimization unit 81 determines the analogy of the failure categories acquired individually from the plurality of subarea settings, and compares the test statistics of the deviations of the records of the manufacturing apparatuses for the respective analogous failure categories, thus detecting the manufacturing process and the manufacturing apparatus which cause the failure.

In the first embodiment, as shown in FIG. 8, the surface of the wafer 90 is divided into four sections by the concentric dividing circles $DR_1$ to $DR_3$ and into eight sections by the radial dividing lines $DL_1$ to $DL_8$, and the common subareas which do not depend on the semiconductor device products are set. The area of each subarea is set larger than the chip area. In such a way, the clustering failure patterns of the pass/fail maps obtained from the respective wafers can be classified. However, there are various sizes in the clustering failure pattern, and the area dividing method shown in FIG. 8 is not always optimum. If the subareas are inappropriate for the clustering failure pattern, there is a possibility that a pass/fail map of a wafer or a lot having a different failure pattern is mixed into the failure category and classified thereinto. When a deviation of the record of the manufacturing apparatus determined by performing a statistical test, in some cases, the manufacturing apparatus causing the failure cannot be detected, and the detection sensitivity is decreased so as to provide an erroneous result.

For example, another classification of the clustering failure patterns is performed for all of the products produced in the manufacturing equipment for the small volume production of many different items by the area dividing method shown in FIG. 8. Consequently, as shown in FIG. 22, categories 7 and 8 are classified as new failure categories. In FIG. 22, as representative examples, pass/fail maps 100n and 100o of wafers belonging to the categories 7, 8 are shown. For example, the category 7 is a large size clustering failure pattern in which a large number of failure chip areas 94c having FC failures are provided on the right side of the pass/fail map 100n. The category 8 is a small size clustering failure pattern in which a small number of failure chip areas 96b having DC failures are provided on the left side of the pass/fail map 100o. The manufacturing processes and the records of the manufacturing apparatuses which belong individually to the categories 7 and 8 are acquired, and the deviations of the number of processed failure wafers are analyzed by the $\chi^2$ test. Consequently, in the category 7, a manufacturing apparatus M1 of the process number 136, which indicates the highest test statistic of 13.6, is determined to be abnormal. In the category 8, a manufacturing apparatus P1 of the process number 96, which indicates the highest test statistic of 12.7, is determined to be abnormal.

Figure 23:
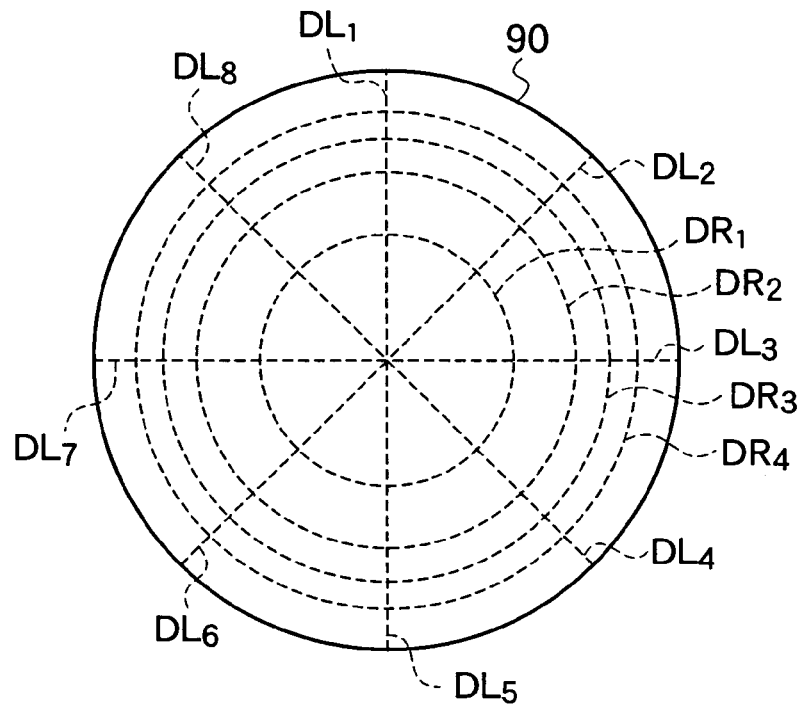
FIG. 23 is a view showing an example of a area dividing method for use in explaining the second embodiment of the present invention.
Figure 24:
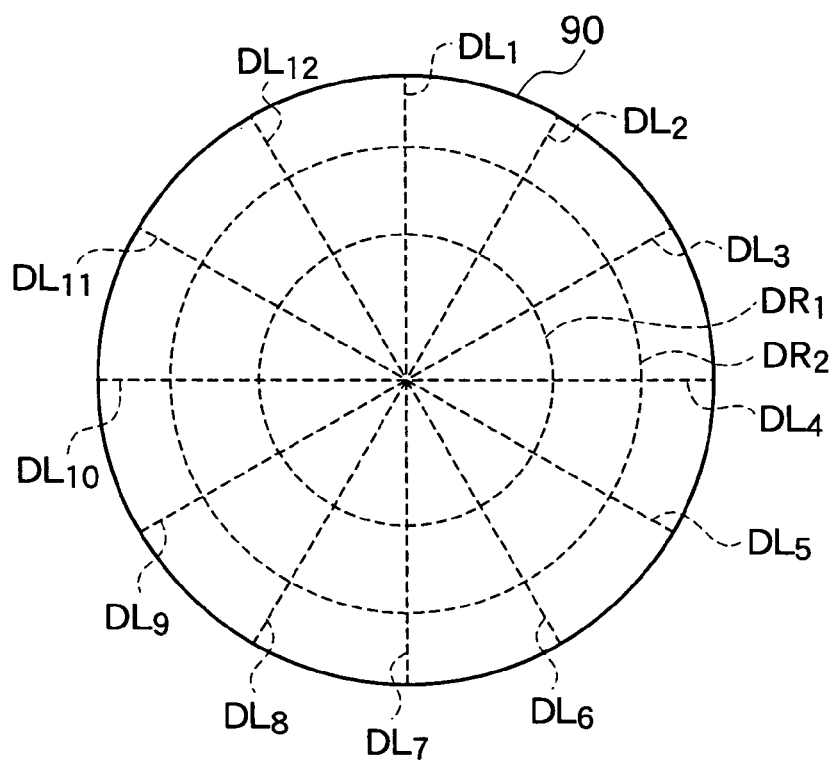
FIG. 24 is a view showing another example of the area dividing method for use in explaining the second embodiment of the present invention.

In the second embodiment, the subareas on the wafer surface are changed. Similar to the first embodiment, the clustering failure patterns are categorized, and the records of the manufacturing process and the manufacturing apparatus are tested. As for the area dividing method, the number of sections divided by the concentric dividing circles is set not only at four as in the first embodiment but at 1 to j. Moreover, the number of sections divided by the radial dividing lines is set not only at eight as in the first embodiment but at 2 to k. The concentric dividing circles for the 1 to j sections and the radial dividing lines for the 2 to k sections are combined, and thus, for example, n ways of the area dividing method are set and stored in the subarea database 62. In an example of such area division, the concentric dividing circles $DR_1$ to $DR_4$ for five sections and the radial dividing lines $DL_1$ to $DL_8$ for eight sections are used as shown in FIG. 23. Moreover, in another example of the area division, the concentric dividing circles $DR_1$ and $DR_2$ for three sections and the radial dividing lines $DL_1$ to $DL_{12}$ for twelve sections are used as shown in FIG. 24.

The subarea setting unit 74 implements the plurality of subarea settings for the pass/fail maps of the respective wafers based on the area dividing methods stored in the subarea database 62. The subarea optimization unit 81 determines analogies from among the categories of the clustering failure patterns, which are obtained from the pass/fail maps, for the set respective subareas. With regard to the determination, product information such as product names, lot numbers, wafer numbers and the like of the wafers belonging to the respective categories obtained by different area division settings is investigated. If ratios of wafers, in the respective categories, which have the same product information are equal to or more than a threshold value, it is determined that the categories are mutually analogous. The clustering failure patterns which have been determined to be analogous are classified into the same category, and are stored in the failure category database 66. In the second embodiment, as the threshold value for the analogy determination, for example, 40% is used. Test results for the plurality of area dividing methods determined to be analogous to those in the respective categories 7 and 8 in FIG. 22 are shown in FIG. 25.

Referring to FIG. 25, with regard to the category 7, the optimum area dividing method D1 is provided according to variations of the test statistic for the area dividing methods. The area dividing method D1 uses a concentric dividing circle for two sections and radial dividing lines for five sections. The test regarding the deviations of the records of the manufacturing apparatuses is performed by use of the number of failure wafers in the category 7, which is obtained by the area dividing method D1. Consequently, a test statistic of 27.6, which is higher than that in the area dividing method of FIG. 22 is obtained, and the process number 136 and the manufacturing apparatus M1, the same as FIG. 22, are determined to be abnormal. With regard to the category 8, the optimum area dividing method D2 is provided according to variations of the test statistic for the area dividing methods. The area dividing method D2 uses concentric dividing circles for six sections and radial dividing lines for twelve sections. The test regarding the deviations of the records of the manufacturing apparatuses is performed by use of the number of failure wafers in the category 8, which is obtained by the area dividing method D2. Consequently, a test statistic of 24.3, which is higher than that in the area dividing method of FIG. 22 is obtained, and a different process number of 82, and the manufacturing apparatus P2 are determined to be abnormal. Wafers having other clustering failure patterns are mixed in the categories acquired in FIG. 22, and errors occur in the test regarding the deviations of the records of the manufacturing apparatuses. In the failure detection system according to the second embodiment, a plurality of area dividing methods are used, and thus the optimum area dividing method to the occurring clustering failure pattern is selected. Hence, even in the manufacturing equipment for the small volume production of many different items, a categorization error of the clustering failure patterns is reduced, thus making it possible to detect, with high sensitivity, the manufacturing process and the manufacturing apparatus which have caused the failure.

Figure 26:
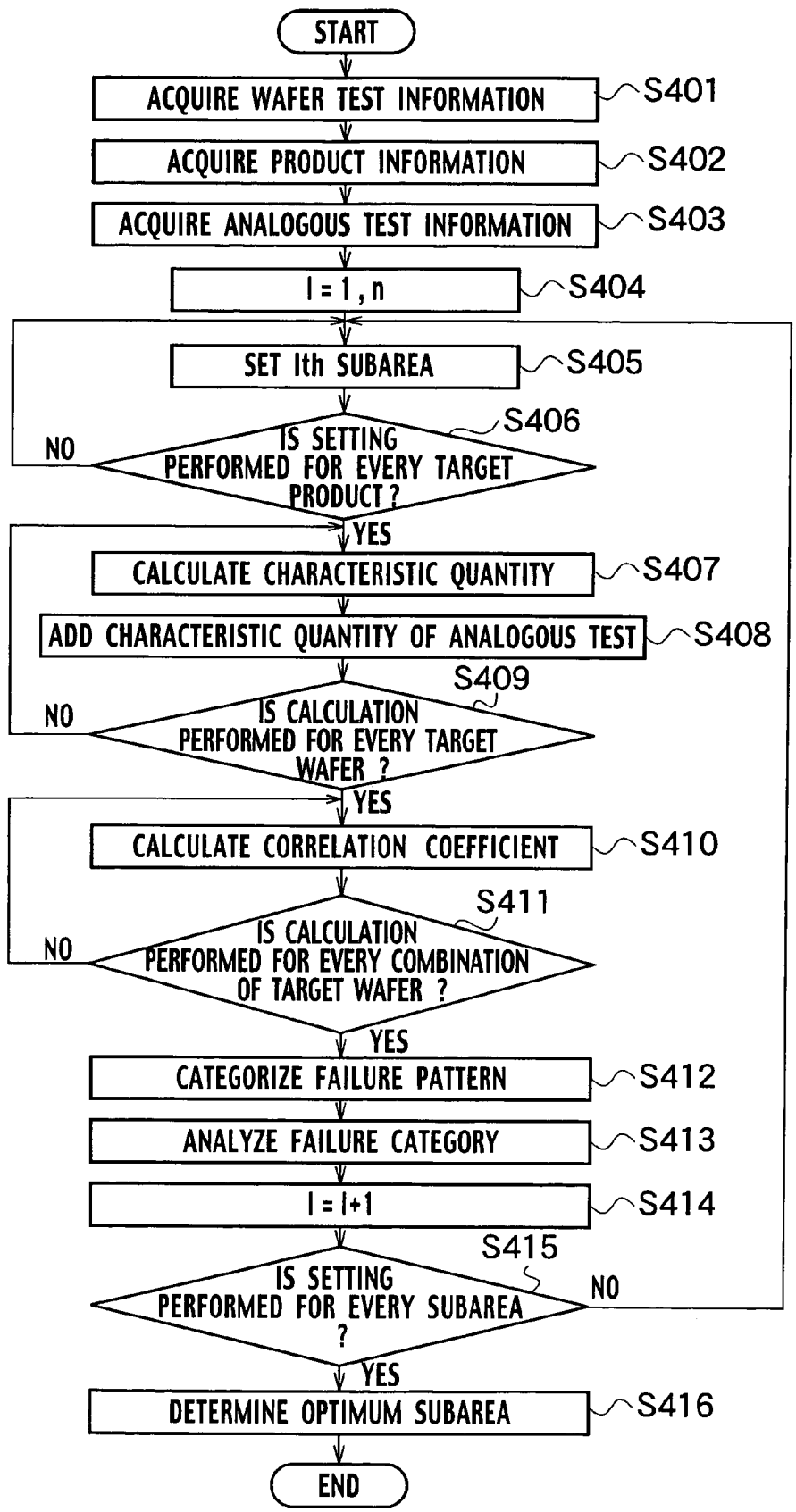
FIG. 26 is a flowchart showing an example of a failure detection method according to the second embodiment of the present invention.

Next, a failure detection method according to the second embodiment of the present invention will be described by use of a flowchart shown in FIG. 26. Wafers for many different items of semiconductor devices from which the failures are to be detected are manufactured in the manufacturing equipment, and for the wafers, the wafer test are performed.

(a) In Step S401, by the wafer test information input unit 68 of the CPU 60a shown in FIG. 21, the pass/fail maps are acquired from the wafer test information database 56 storing the results of the wafer tests of the plurality of wafers.

(b) In Step S402, by the product information input unit 70, product information of the semiconductor device products manufactured in the manufacturing equipment is acquired from the product information database 52, and the product information is appended to the pass/fail map of each wafer.

(c) In Step S403, the analogous test information in which the electrical tests performed for each wafer in the wafer tests are classified so as to correspond to the analogous failures is acquired from the analogous test information database 58 by the analogous test information input unit 72.

(d) In Step S404, for the area dividing method I (I=1 to n), I is set equal to 1, and in Step S405, by the subarea setting unit 74, the area dividing method 1 is acquired from the subarea database 62. Furthermore, by the subarea setting unit 74, the chip groups belonging to the respective subareas divided by the area dividing method 1 are obtained for the pass/fail map acquired by the wafer test information input unit 68. In Step S406, the setting of the area dividing method 1 is repeated until the subareas are set for all of the wafers in all of the target products.

(e) In Step S407, by the characteristic quantity calculation unit 76, the characteristic quantity is calculated by statistically processing the number of failed chips included in the chip group of each subarea based on the pass/fail map of each wafer. Furthermore, in Step S408, the characteristic quantity of the analogous failures of the pass/fail map of the same wafer is appended based on the analogous test information. The characteristic quantity calculated based on the pass/fail map of each wafer is stored in the characteristic quantity database 64. The calculations of the characteristic quantity in Steps S407 and S408 are repeated until the characteristic quantities are calculated for all of the target wafers.

(f) In Step S410, by the categorization unit 78, the correlation coefficients R of the characteristic quantities among the wafers are calculated for the characteristic quantities in the wafers of all of the products, which are acquired from the characteristic quantity database 64. In Step S411, the calculation of the correlation coefficients R in Step S410 is repeated until the correlation coefficients R of all of the target pairs of wafers are calculated. Furthermore, by the categorization unit 78, it is determined, in Step S412, that the failure patterns of each pair of wafers in which the correlation coefficients R are equal to or more than the preset threshold value are mutually analogous, and the categorization of the clustering failure patterns is implemented. The categorized clustering failure patterns are stored in the failure category database 66.

(g) In Step S413, by the failure category analysis unit 80, the pass/fail maps of the wafers belonging to each category of the categorized clustering failure patterns are acquired from the failure category database 66. When the wafers belonging to the same category are obtained from among the plurality of products, a test statistic of the manufacturing apparatus causing the failure is calculated by statistically analyzing the deviations of the records of the manufacturing apparatuses based on the manufacturing record of each wafer belonging to the category.

(h) In Step S414, the area dividing method 1 is changed to the area dividing method 2, and in Step S415, processing of Steps S405 to S414 is repeated until the area dividing method reaches n.

(i) In Step S416, by the subarea optimization unit 81, the analogies among the categories of the clustering failure patterns obtained from the pass/fail maps are determined for the respective subarea settings by the area dividing methods 1 to n. The clustering failure patterns determined to be analogous are classified into the same category, and stored in the failure category database 66. Furthermore, when the wafers belonging to the same category are obtained among the plurality of area dividing methods, by the subarea optimization unit 81, the test statistics calculated for the respective area dividing methods belonging to the category are compared with one another. By the area dividing method giving the maximum test statistic, the manufacturing process and the manufacturing apparatus which have caused the failure are detected.

As described above, according to the failure detection method according to the second embodiment of the present invention, the analogous clustering failure patterns are categorized by use of the plurality of area dividing methods, and the test of the number of failure wafers belonging to the same category is implemented for each of the area dividing methods. Hence, even in the manufacturing equipment for the small volume production of many different items, the error in the categorization of the clustering failure patterns is reduced, and a high sensitive detection of the manufacturing process and the manufacturing apparatus which have caused the failure, may be possible.

Other Embodiments

The first and second embodiments of the present invention have been described by use of the failure density as the characteristic quantity. However, a different statistic may be used as the characteristic quantity. For example, the characteristic quantity may be a quantity obtained by quantifying a degree of deviation of the failures to each subarea. As a quantifying method, a characteristic quantity represented in the following equation (7) may be used:

$$k=1-2*f0/(f1+f0) \tag{7}$$

where a failure density of a target subarea is f1 and a failure density of a area other than the target subarea is f0. The deviation k takes a value +1 when the failures are completely deviated to the target subarea, a value 0 when the failures are evenly distributed, and takes a value −1 when the failures are deviated to a area other than the target subarea. The deviation k takes a continuous value from +1 to −1 in accordance with the degree of deviation of the failures. Moreover, as another quantifying method, another deviation of the failures to the subarea may be obtained by the $\chi^2$ test. In this case, the following equations (8) and (9) are used:

$$e1=(f1+f0)*A1/(A1+A0) \tag{8}$$

$$e2=(f1+f0)*A0/(A1+A0) \tag{9}$$

where an area of the target subarea is A1, and an area of the area other than the target subarea is A0.

From the above equations (8) and (9), the following equation is derived:

$$\chi^2=(f1-e1)^2/e1+(f0-e0)^2/e0 \tag{10}$$

In such a way, a value of $\chi^2$ may be used as the characteristic quantity.

Various modifications will become possible for those skilled in the art after storing the teachings of the present disclosure without departing from the scope thereof.

What is claimed is:

1. A failure detection system, comprising:
   a wafer test information input unit configured to acquire pass/fail maps for respective wafers for a plurality of types of semiconductor devices, the pass/fail maps displaying failure chip areas based on results of a plurality of electrical tests performed on a plurality of chip areas assigned on the respective wafers;
   an analogous test information input unit configured to classify the electrical tests into a plurality of analogous electrical tests with regard to analogous failures among the plurality of types of semiconductor devices;
   a subarea setting unit configured to assign a plurality of subareas, each of which is common to the types of semiconductor devices on a surface of the wafer;
   a characteristic quantity calculation unit configured to statistically calculate characteristic quantities based on a number of the failure chip areas included in the respective subareas for each of the analogous electrical tests; and
   a categorization unit configured to obtain correlation coefficients between the characteristic quantities corresponding to the respective subareas of the wafers, and to classify clustering failure patterns of the failure chip areas into categories by comparing the correlation coefficients with a threshold value.

2. The system of claim 1, further comprising a product information input unit configured to append manufacturing records including manufacturing processes and manufacturing apparatuses for the semiconductor devices to the pass/fail maps.

3. The system of claim 1, wherein the characteristic quantities are failure densities of the failure chip areas displayed by the pass/fail maps for the respective subareas.

4. The system of claim 1, further comprising a failure category analysis unit configured to determine a cause of the failures by use of test statistics obtained by statistically analyzing deviations of records of manufacturing apparatuses based on manufacturing records of the wafers belonging to the categories.

5. The system of claim 4, wherein the test statistic is a chi-square test statistic.

6. The system of claim 4, further comprising a subarea database configured to store a plurality of area dividing methods for setting different subareas, each of the area dividing methods setting subareas common to the types of semiconductor devices.

7. The system of claim 6, further comprising a subarea optimization unit configured to determine an optimum area dividing method for the respective subareas set by the plurality of area dividing methods, by classifying the clustering failure patterns obtained from the pass/fail maps into the categories for each of the area dividing methods, obtaining the same category by determining analogies among the respective categories corresponding to each of the area dividing methods, and by comparing the test statistics calculated for the wafers belonging to the same category for each of the area dividing methods.

8. The system of claim 1, wherein the subareas are areas divided by combinations of at least one of concentric dividing circles concentric with a center of the wafer and a plurality of radial dividing lines drawn from the center with an equal angle having a length equal to a radius of the wafer.

9. The system of claim 1, wherein each of the subareas has an area including at least one of the chip areas.

10. A failure detection method, comprising:
  manufacturing wafers having a plurality of types of semiconductor devices in manufacturing equipment;
  acquiring pass/fail maps displaying failure chip areas based on results of a plurality of electrical tests performed on a plurality of chip areas assigned on the respective wafers;
  classifying the electrical tests into a plurality of analogous electrical tests with regard to analogous failures among the plurality of types of semiconductor devices;
  assigning a plurality of subareas, each of which is common to the types of semiconductor devices on a surface of the wafer;
  statistically calculating characteristic quantities based on a number of the failure chip areas included in the respective subareas for each of the analogous electrical tests; and
  obtaining correlation coefficients between the characteristic quantities of the wafers corresponding to the subareas to classify clustering failure patterns of the failure chip areas into categories by comparing the correlation coefficients with a threshold value.

11. The method of claim 10, wherein the subareas are divided by combinations of at least one of concentric dividing circles concentric with a center of the wafer and a plurality of radial dividing lines drawn from the center with an equal angle having a length equal to a radius of the wafer.

12. The method of claim 10, wherein each of the subareas has an area including at least one of the chip areas.

13. The method of claim 10, wherein the characteristic quantities are failure densities of the failure chip areas displayed by the pass/fail maps for the respective subareas.

14. The method of claim 10, further comprising appending manufacturing records including manufacturing processes and manufacturing apparatuses of the semiconductor devices to the pass/fail maps.

15. The method of claim 10, further comprising determining a cause of the failures by use of test statistics obtained by statistically analyzing deviations of records of manufacturing apparatuses based on manufacturing records of the wafers belonging to the categories.

16. The method of claim 15, wherein different subareas common to the types of semiconductor devices are set as the subareas.

17. The method of claim 16, further comprising:
  obtaining the same category by determining analogies among the respective categories corresponding to the respective different subareas;
  determining the cause of the failures based on the subarea giving a maximum test statistic for the respective different subareas by comparing the test statistics calculated for the different subareas for the wafers belonging to the same category when the wafers belonging to the same category are obtained among the different subareas.

18. The method of claim 15, wherein the test statistic is calculated from a chi-square test.

19. A computer program product stored on a computer-readable medium of a computer and configured to be executed by a computer, comprising:
  an instruction of acquiring pass/fail maps for respective wafers of a plurality of types of semiconductor devices, the pass/fail maps displaying failure chip areas based on results of a plurality of electrical tests performed on a plurality of chip areas assigned on each of the respective wafers;
  an instruction of classifying the electrical tests into a plurality of analogous electrical tests with regard to analogous failures among the plurality of types of semiconductor devices;
  an instruction of assigning a plurality of subareas, each of which is common to the types of semiconductor devices on a surface of the wafer;
  an instruction of statistically calculating characteristic quantities based on a number of the failure chip areas included in the respective subareas for each of the analogous electrical tests; and
  an instruction of obtaining correlation coefficients between the characteristic quantities of the wafers corresponding to the respective subareas to classify clustering failure patterns of the failure chip areas into categories by comparing the correlation coefficients with a threshold value.

20. The computer program product of claim 19, wherein the characteristic quantities are failure densities of the failure chip areas displayed by the pass/fail maps for the respective subareas.

* * * * *